United States Patent
Blackburn et al.

(10) Patent No.: US 10,586,657 B2
(45) Date of Patent: Mar. 10, 2020

(54) NANOSTRUCTURE-CONTAINING ORGANIC-METAL HALIDE PEROVSKITES

(71) Applicant: Alliance for Sustainable Energy, LLC, Golden, CO (US)

(72) Inventors: Jeffrey Lee Blackburn, Golden, CO (US); Kai Zhu, Littleton, CO (US); Mengjin Yang, Dallas, TX (US); Anne-Marie Dowgiallo, Tampa, FL (US); Rachelle Rosemarie Ihly, Parker, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 34 days.

(21) Appl. No.: 15/777,841

(22) PCT Filed: Nov. 30, 2016

(86) PCT No.: PCT/US2016/064156
§ 371 (c)(1),
(2) Date: May 21, 2018

(87) PCT Pub. No.: WO2017/095886
PCT Pub. Date: Jun. 8, 2017

(65) Prior Publication Data
US 2018/0374651 A1     Dec. 27, 2018

Related U.S. Application Data

(60) Provisional application No. 62/261,720, filed on Dec. 1, 2015.

(51) Int. Cl.
*H01L 31/00* (2006.01)
*H01G 9/20* (2006.01)
(Continued)

(52) U.S. Cl.
CPC ......... *H01G 9/2009* (2013.01); *H01G 9/2018* (2013.01); *H01L 51/0032* (2013.01);
(Continued)

(58) Field of Classification Search
CPC .............. H01G 9/2009; H01L 51/0032; H01L 51/0048
See application file for complete search history.

(56) References Cited

U.S. PATENT DOCUMENTS

2015/0287852 A1    10/2015  Leung et al.
2016/0020352 A1*    1/2016  Konstantatos .. H01L 31/035218
                                                          257/24

FOREIGN PATENT DOCUMENTS

WO        2015140548 A1    9/2015

OTHER PUBLICATIONS

Habisreutinger et al., "Carbon Nanotube/Polymer Composites as a Highly Stable Hole Collection Layer in Perovskite Solar Cells," Nano Lett. 2014, 14, 5561-5568 (Year: 2014).*
(Continued)

*Primary Examiner* — Angelo Trivisonno
(74) *Attorney, Agent, or Firm* — Michael A. McIntyre

(57) ABSTRACT

Described herein is a device that includes an alkyl ammonium metal halide perovskite layer, and a nanostructured semiconductor layer in physical contact with the alkyl ammonium metal halide perovskite layer. The alkyl ammonium metal halide perovskite layer may include methyl ammonium cations. The alkyl ammonium metal halide perovskite layer may include anions of at least one of chlorine, bromine, astatine, and/or iodine. The alkyl ammonium metal halide perovskite layer may include cations of a metal in a 2+ valence state. The metal may include at least one of lead, tin, and/or germanium.

17 Claims, 30 Drawing Sheets

(51) Int. Cl.
H01L 51/00 (2006.01)
H01L 51/42 (2006.01)
H01L 51/44 (2006.01)

(52) U.S. Cl.
CPC .......... H01L 51/426 (2013.01); H01L 51/442 (2013.01); *H01L 51/006* (2013.01); *H01L 51/0036* (2013.01); *H01L 51/0048* (2013.01); *H01L 51/0056* (2013.01); *H01L 51/0077* (2013.01); *H01L 51/4226* (2013.01)

(56) References Cited

OTHER PUBLICATIONS

Wang et al., "Low Temperature Solution Processed Planar Heterojunction Perovskite Solar Cells with CdSe Nanocrystal as Electron Transport/Extraction Layer," J. Mater. Chem. C, 2014, 2, 9087-9090 (Year: 2014).*
Supplementary Partial European Search Report dated Jul. 2, 2019, received in corresponding European patent application, 14 pages.
Bi et al., "Effect of Different Hole Transport Materials on Recombination in $CH_3NH_3PbI_3$ Perovskite-Sensitized Mesoscopic Solar Cells," Journal of Physical Chemistry Letters, 2013, vol. 4, pp. 1532-1536.
Cai et al., "An efficient hole transport material composite based on poly(3-hyxylthiophene) and bamboo-structured carbon nanotubes for high performance perovskite solar cells," Journal of Materials Chemistry A, vol. 3, 2015, pp. 2784-2793.
Chandra et al., "Stable Charge-Transfer Doping of Transparent Single-Walled Carbon Nanotube Films," Chemistry of Materials, 2010, vol. 22, pp. 5179-5183.
Dowgiallo et al., "Ultrafast Spectroscopic Signature of Charge Transfer between Single-Walled Carbon Nanotubes and C60," ACS Nano, 2014, vol. 8, No. 8, pp. 8573-8581.
Ferguson et al., "Trap-limited carrier recombination in single-walled carbon nanotube heterojunctions with fullerene acceptor layers," Physical Review B, 2015, vol. 91, pp. 245311-1 through 245311-8.
Gonzalez-Pedro et al., "General Working Principles of $CH_3NH_3PbX_3$ Perovskite Solar Cells," Nano Letters, 2014, vol. 14, pp. 888-893.
Guillot et al., "Precision printing and optical modeling of ultrathin $SWCNT/C_{60}$ heterojunction solar cells," Nanoscale, 2015, vol. 7, pp. 6556-6566.
Habisreutinger et al., "Enhanced Hole Extraction in Perovskite Solar Cells Through Carbon Nanotubes," Journal of Physical Chemistry Letters, 2014, vol. 5, pp. 4207-4212.
Habisreutinger et al., "Carbon Nanotube/Polymer Composites as a Highly Stable Hole Collection Layer in Perovskite Solar Cells," Nano Letters, 2014, vol. 14, pp. 5561-5568.
Jeon et al., "Single-Walled Carbon Nanotube Film as Electrode in Indium-Free Planar Heterojunction Perovskite Solar Cells: Investigation of Electron-Blocking Layers and Dopants," Nano Letters, 2015, vol. 15, pp. 6665-6671.
Lee et al., "Hierarchically Structured Hole Transport Layers of Spiro-OMeTAD and Multiwalled Carbon Nanotubes for Perovskite Solar Cells," CHEMSUSCHEM Communications, 2015, vol. 8, pp. 2358-2362.
Marchioro et al., "Unravelling the mechanism of photoinduced charge transfer processes in lead iodide perovskite solar cells," Nature Photonics, 2014, vol. 8, pp. 250-255.
Mistry et al., "High-Yield Dispersions of Large-Diameter Semiconducting Single-Walled Carbon Nanotubes with Tunable Narrow Chirality Distributions," ACS Nano, 2013, vol. 7, No. 3, pp. 2231-2239.
Piatkowski et al., "Direct monitoring of ultrafast electron and hole dynamics in perovskite solar cells," Phys. Chem. Chem. Phys., 2015, vol. 17, pp. 14674-14684.
Ponseca, Jr. et al., "Organometal Halide Perovskite Solar Cell Materials Rationalized: Ultrafast Charge Generation, High and Microsecond-Long Balanced Mobilities, and Slow Recombination," Journal of the American Chemical Society, 2014, vol. 136, pp. 5189-5192.
Schulz et al., "Interface energetics in organo-metal halide perovskite-based photovoltaic cells," Energy & Environmental Science, 2014, vol. 7, pp. 1377-1381.
Schulz et al., "Charge Transfer Dynamics between Carbon Nanotubes and Hybrid Organic Metal Halide Perovskite Films," Journal of Physical Chemistry Letters, 2016, vol. 7, pp. 418-425.
Snaith et al., "Anomalous Hysteresis in Perovskite Solar Cells," Journal of Physical Chemistry Letters, 2014, vol. 5, pp. 1511-1515.
Trinh et al., "Many-body interactions in photo-excited lead iodide perovskite," Journal of Materials Chemistry A, 2015, vol. 3, pp. 9285-9290.
Xing et al., "Long-Range Balanced Electron-and Hole-Transport Lengths in Organic-Inorganic CH3NH3PbI3," Science, 2013, vol. 342, pp. 344-347.
Yuma et al., "Biexciton, single carrier, and trion generation dynamics in single-walled carbon nanotubes," Physical Review B, 2013, vol. 87, pp. 205412-1 through 205412-7.
Zhou et al., "Interface engineering of highly efficient perovskite solar cells," Science, 2014, vol. 345, Issue 6196, pp. 542-546.
Search Report and Written Opinion from corresponding PCT application, PCT/US16/64156, dated Feb. 6, 2017, 7 pages.

* cited by examiner

NANOSTRUCTURE-CONTAINING ORGANIC-METAL HALIDE PEROVSKITES

CROSS-REFERENCE TO RELATED APPLICATIONS

This application claims the benefits of U.S. Provisional Application No. 62/261,720 filed Dec. 1, 2015, the contents of which are incorporated herein by reference in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Metal-halide based perovskite solar cells have rapidly emerged as a promising alternative to traditional inorganic and thin-film photovoltaics. Metal-halide perovskite solar cells have demonstrated dramatic improvements in efficiencies over the past six years, rising from about 3% in 2009 to above 20% in 2015. These hybrid organic/inorganic photovoltaics embody many advantages of inexpensive solution-processed solar cells (e.g. bulk heterojunction organic photovoltaic (PV) devices, dye-sensitized cells, etc.), but at greater power conversion efficiencies that compare favorably with established inorganic technologies, such as CdTe and polycrystalline silicon. Despite the rapid rise in efficiency, a number of fundamental operational principles of perovskite solar cells are still poorly understood. Particularly important are the mechanisms and rates by which photogenerated charge carriers (1) recombine within neat perovskite films (either within the bulk or through traps), (2) diffuse to interfaces with electron and hole transport layers (ETL and HTL), (3) are transferred across these interfaces, and (4) recombine following extraction by the ETL and HTL. The rates for these competing processes help to determine the ultimate efficiency of devices. Rapid diffusion and interfacial charge transfer compete with recombination within the perovskite layer and aid in charge extraction by the ETL and HTL, enhancing photocurrent. Suppressing back-transfer from the ETL and HTL into the alkyl ammonium metal halide perovskite layer should result in long-lived charge separation and reduced recombination losses to the open circuit voltage and fill factor.

SUMMARY

An aspect of the present disclosure is a device that includes an alkyl ammonium metal halide perovskite layer, and a nanostructured semiconductor layer in physical contact with the alkyl ammonium metal halide perovskite layer. In some embodiments of the present disclosure, the alkyl ammonium metal halide perovskite layer may include methyl ammonium cations. In some embodiments of the present disclosure, the alkyl ammonium metal halide perovskite layer may include anions of at least one of chlorine, bromine, astatine, and/or iodine. In some embodiments of the present disclosure, the alkyl ammonium metal halide perovskite layer may include cations of a metal in a 2+ valence state. In some embodiments of the present disclosure, the metal may include at least one of lead, tin, and/or germanium.

In some embodiments of the present disclosure, the nanostructured semiconductor layer may include a plurality of an organic nanostructure. In some embodiments of the present disclosure, the organic nanostructure may include at least one of carbon nanotubes, graphene quantum dots, and or carbon dots. In some embodiments of the present disclosure, the nanostructured semiconductor layer may include a plurality of an inorganic nanostructure. In some embodiments of the present disclosure, the inorganic nanostructure may include at a transition metal dichalcogenide. In some embodiments of the present disclosure, the inorganic nanostructure may include at least one of phosphine, silicone, and/or germanene. In some embodiments of the present disclosure, the inorganic nanostructure may include at least one of quantum dots, nanorods, nanowires, and/or nanosheets. In some embodiments of the present disclosure, the inorganic nanostructure may include at least one of CdS, CdSe, PbSe, InAs, InP, and/or InSb.

In some embodiments of the present disclosure, the device may further include a hole transport layer, where the nanostructured semiconductor layer may be positioned between the hole transport layer and the alkyl ammonium metal halide perovskite layer, and the nanostructured semiconductor layer may be in physical contact with the hole transport layer. In some embodiments of the present disclosure, the hole transport layer may include at least one of spiro-MeOTAD, polyhexyl (3-thiophene), and/or an inorganic oxide. In some embodiments of the present disclosure, the device may further include a conducting layer positioned above the hole transport layer. In some embodiments of the present disclosure, the device may further include an electron transport layer, where the alkyl ammonium metal halide perovskite layer may be positioned between the hole transport layer and the electron transport layer. In some embodiments of the present disclosure, the device may further include a transparent conducting oxide layer positioned below the electron transport layer. In some embodiments of the present disclosure, the device may further include a substrate positioned below the transparent conducting oxide layer.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 9a illustrates yield-mobility product as a function of incident photon fluence for four different samples. FIG. 9b illustrates time-resolved microwave conductivity transients for the same four samples, normalized at the peak (end-of-pulse) intensity. Excitation wavelength was 430 nm, backside illumination.

FIG. 10a illustrates a kinetic scheme and schematic for dynamic processes in photoexcited MAPI absorber layer with SWCNT HTL and $TiO_2$ ETL. Processes above the dashed line result in charge extraction, and below line result in recombination. Each process is color-coded. FIG. 10b illustrates a schematic of the time scale of each process described in FIG. 10a, as well as the measurement technique and probe wavelength used to extract the kinetic information for the processes.

FIG. 11a illustrates a device schematic for a MAPI solar cell with a s-SWCNT interfacial layer between the MAPI absorber layer and the spiro-MeOTAD HTL. FIG. 11b illustrates J-V curves for typical MAPI devices, with or without a 5 nm (6,5) s-SWCNT interfacial layer. FIG. 11c illustrates the external quantum efficiency for the same two devices as in FIG. 11b.

REFERENCE NUMBERS

Figure 1:
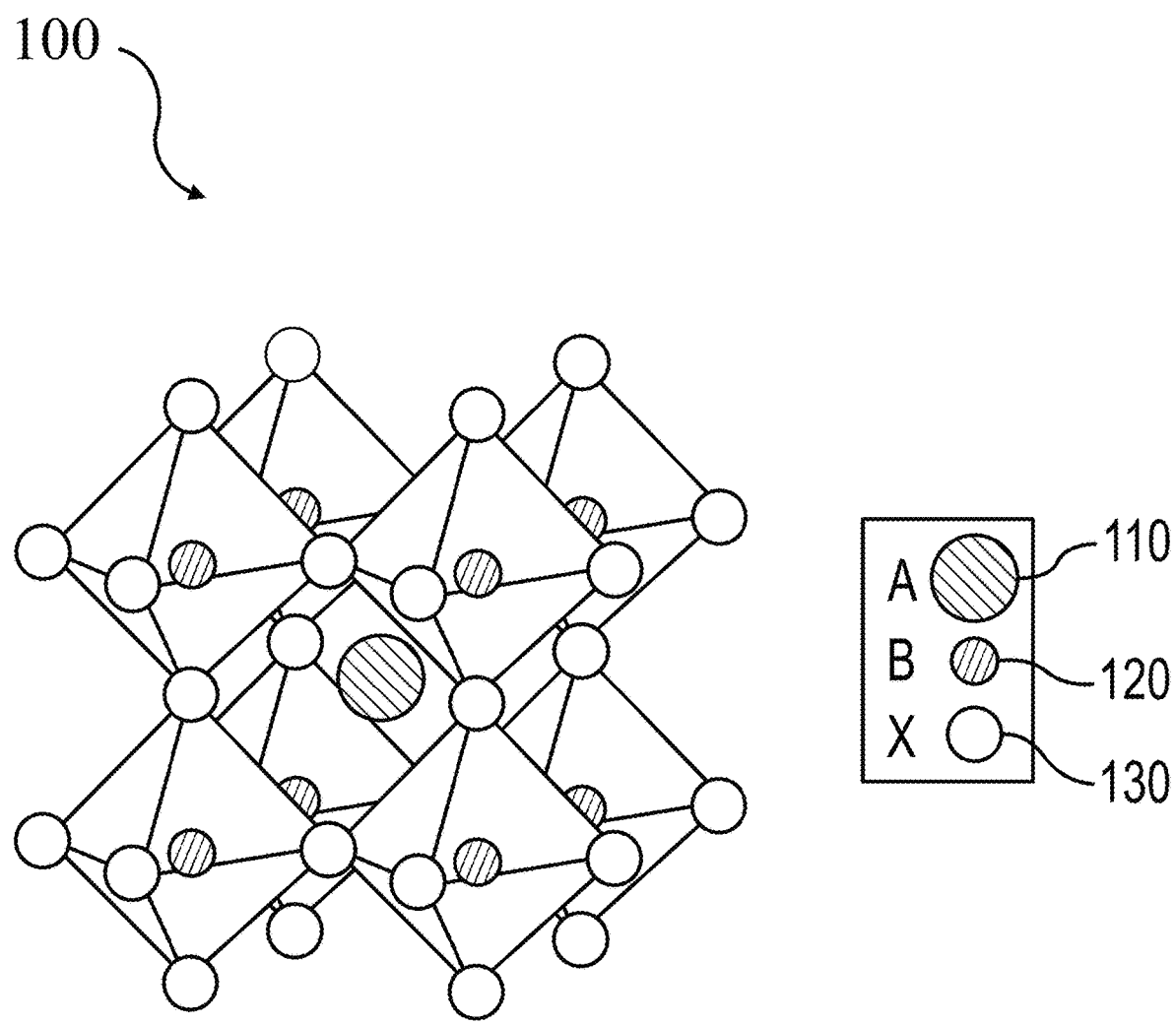
FIG. 1 illustrates alkyl ammonium metal halide perovskite crystal structure, according to some embodiments of the present disclosure.

| | |
|---|---|
| 100 | alkyl ammonium metal halide perovskite |
| 110 | cation |
| 120 | cation |
| 130 | anion |
| 200 | device |
| 210 | transparent substrate layer |
| 220 | transparent conducting oxide layer |

| | |
|---|---|
| 230 | electron transport layer |
| 240 | alkyl ammonium metal halide perovskite layer |
| 250 | nanostructured semiconductor layer |
| 260 | hole transport layer |
| 270 | conducting layer |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure demonstrates that highly enriched semiconducting single-walled carbon nanotube films enable rapid hole extraction from an alkyl ammonium metal halide perovskite layer (absorber layer) and extremely slow back-transfer and recombination. The energetically narrow and distinct spectroscopic signatures for charges within these carbon nanotube thin films enables the unambiguous temporal tracking of each charge carrier with time-resolved spectroscopies covering many orders of magnitude. It is also demonstrated that the use of thin interface layers of semiconducting single-walled carbon nanotubes between the alkyl ammonium metal halide perovskite layer and a prototypical hole transport layer significantly improves device efficiency and stability, and reduces hysteresis.

Despite their importance, the time scales for charge extraction by the ETL and HTL (as well as subsequent back-transfer and recombination) in perovskite solar cells are still poorly understood. An important contributing factor to this uncertainty is the lack of specific and narrow spectral signatures for charges in traditional ETL and HTL materials. For example, both $TiO_2$ and 2,2',7,7'-tetrakis-(N,N-di-p-methoxyphenyl-amine)-9,9'-spirobi-fluorene (spiro-MeOTAD), prototypical ETL and HTL materials, have broad featureless near-infrared (NIR) absorptions when charged with excess electrons or holes, respectively, and charge carriers within the alkyl ammonium metal halide perovskite layer itself also contribute to broad NIR absorption. These overlapping signals typically require complicated analyses for transient absorption (TA) measurements at a single wavelength (e.g. 1400 nm), where carriers within all three layers of a device stack (ETL, alkyl ammonium metal halide perovskite layer, and HTL) may contribute some ill-defined amount to the observed transient signal. Thus, the present disclosure describes a technologically relevant experimental system that addresses these important challenges by utilizing a charge extraction layer (thin films of highly enriched semiconducting single-walled carbon nanotubes) with a well-defined and energetically narrow spectral signature in the charged state.

Highly enriched semiconducting SWCNTs (s-SWCNTs) can have important advantages for both fundamental interfacial charge transfer studies and improving efficiency in perovskite solar cells. First, the sharp optical transitions (spectral width ca. 30 meV) of species-pure s-SWCNTs can be used as sensitive spectroscopic signatures for charge transfer to or from s-SWCNTs. The narrow peak widths of these optical transitions solve the problem of broad absorption of charges in conventional charge extraction layers, and enable the tracking of charge extraction with material specificity. Additionally, ground-state charge transfer at the interface between methyl ammonium lead iodide ($MAPbI_3$) and s-SWCNTs creates band bending in the s-SWCNT layer that should in principle hinder the back transfer of holes from the SWCNT HTL to the alkyl ammonium metal halide perovskite. Thus, the present disclosure utilizes s-SWCNT layers to serve two roles: (i) serve as a material-specific spectroscopic signature to track charge extraction and recombination within a $MAPbI_3$ device stack and (ii) enable very long-lived charge separation, enhancing the performance of $MAPbI_3$ solar cells.

The present disclosure summarizes studies examining electron and hole extraction from $MAPbI_3$ alkyl ammonium metal halide perovskite layers using time-resolved spectroscopy over time scales spanning femtoseconds to ca. 400 microseconds. The sharp excitonic transitions of a high-purity (6,5) s-SWCNT HTL enable the unambiguous deconvolution of the kinetic pathways for both electrons and holes. The results demonstrate that s-SWCNT HTLs can efficiently extract holes from an alkyl ammonium metal halide perovskite layer in sub-picosecond time scales, and that the resulting back-transfer of holes to $MAPbI_3$ occurs over hundreds of microseconds. The efficient charge extraction enabled by s-SWCNTs contrasts sharply with a spiro-MeOTAD HTL and a compact $TiO_2$ ETL, both of which are found to be relatively inefficient at extracting holes and electrons, respectively. The huge disparity (up to nine orders of magnitude) in the time scales for hole extraction and back-transfer to and from the s-SWCNTs suggest that s-SWCNT HTLs provide the efficient and long-lived charge separation needed for high-efficiency solar cells. This supposition is confirmed by the determination that an interfacial layer of s-SWCNTs, as thin as 5 nm in between the $MAPbI_3$ absorber layer and a spiro-MeOTAD HTL, improves the power conversion efficiency from ca. 14.2% to ca. 16.3%.

FIG. 1 illustrates that alkyl ammonium metal halide perovskites 100 may organize into cubic crystalline structures and described by the general formula $ABX_3$, where X (130) is an anion and A (110) and B (120) are cations, typically of different sizes (A typically larger than B). In a cubic unit cell, the B-cation 120 resides at the eight corners of a cube, while the A-cation 110 is located at the center of the cube and with 12 X-anions 130 centrally located between B-cations 120 along each edge of the unit cell. Typical inorganic perovskites include calcium titanium oxide (calcium titanate) minerals such as, for example, $CaTiO_3$ and $SrTiO_3$. In some embodiments of the present disclosure, the A-cation 110 may include a nitrogen-containing organic compound such as an alkyl ammonium compound. A B-cation 120 may include a metal and an X-anion 130 may include a halogen.

Additional examples for cation A (110) include organic cations and/or inorganic cations. Organic cations of A (110) may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic cations of A (110) include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), and/or any other suitable nitrogen-containing organic compound. In other examples, a cation A (110) may include an alkylamine. Thus, a cation A (110) may include an organic component with one or more amine groups. For example, cation A (110) may be an alkyl diamine halide such as formamidinium ($CH(NH_2)_2$).

Examples of metal cations 120 include, for example, lead, tin, germanium, and or any other 2+ valence state metal that can charge-balance the alkyl ammonium metal halide perovskite 100. Examples for the anion X (130) include halogens: e.g. fluorine, chlorine, bromine, iodine and/or astatine. In some cases, the alkyl ammonium metal halide perovskite may include more than one anion X (130), for example pairs of halogens; chlorine and iodine, bromine and iodine, and/or any other suitable pairing of halogens. In other cases, the alkyl ammonium metal halide perovskite 100 may include two or more halogens of fluorine, chlorine, bromine, iodine, and/or astatine.

Thus, cation A (110), cation B (120), and anion X (130) may be selected within the general formula of $ABX_3$ to produce a wide variety of alkyl ammonium metal halide perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a alkyl ammonium metal halide perovskite 100 may have more than one halogen element, where the various halogen elements are present in none integer quantities; e.g. x is not equal to 1, 2, or 3. In addition, alkyl ammonium metal halide perovskites 100, like other organic-inorganic perovskites, can form three-dimensional (3-D), two-dimensional (2-D; e.g. sheets), one-dimensional (1-D; e.g. wires) or zero-dimensional (0-D; e.g. quantum dots) networks, possessing the same unit structure. In some embodiments of the present disclosure, the alkyl ammonium metal halide perovskite may be nanostructured.

As stated above, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Figure 2:
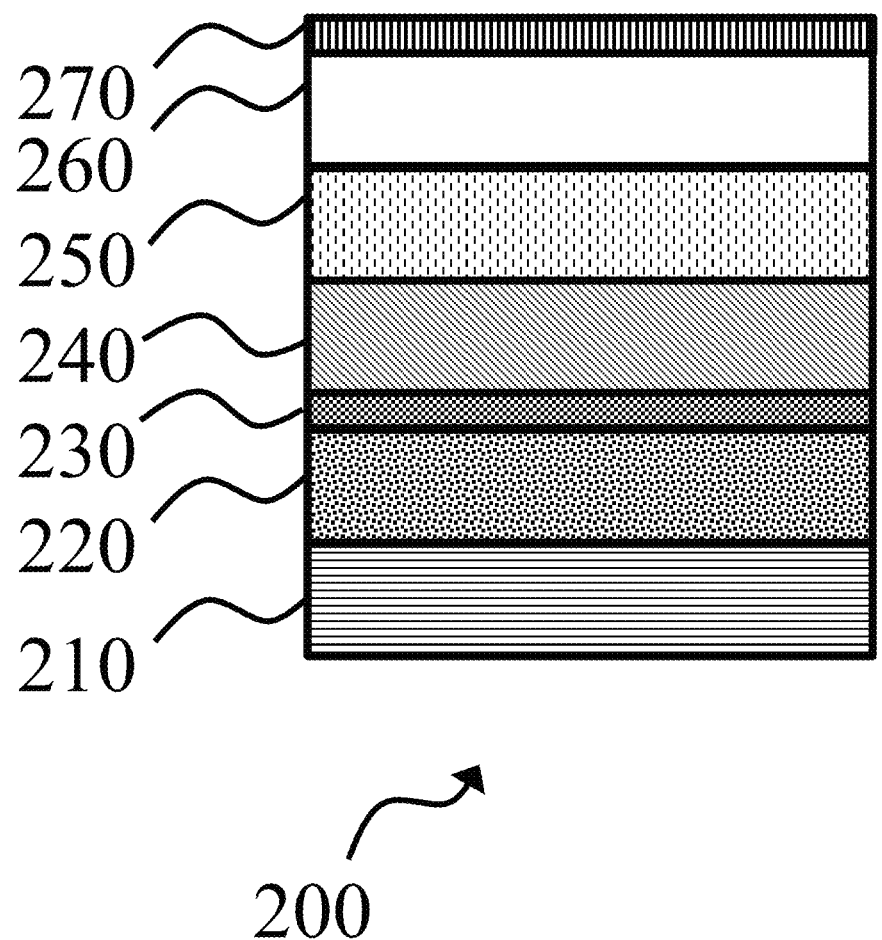
FIG. 2 illustrates a device that includes an alkyl ammonium metal halide perovskite layer in physical contact with a nanostructured semiconductor layer, according to some embodiments of the present disclosure.

FIG. 2 illustrates a device 200, for example a photovoltaic device that includes a nanostructured semiconductor layer 250, for example the semiconductor form of single-walled carbon nanotubes (s-SWCNT). In other examples, the nanostructured semiconductor layer 250 may include a nanostructured transition metal dichalcogenide $M_yX_z$, where M includes Mo, W, Ti, V, Zr, and/or Hf and X includes S, Se, and/or Te. In further examples, the nanostructured semiconductor layer 250 may include phosphine (black phosphorous) and/or its variants, silicene, germanene, and/or semiconducting graphene (e.g. graphene quantum dots). In further examples, the nanostructured semiconductor layer 250 may include "carbon dots", nanostructured carbon-based semiconductors. In yet further examples, the nanostructured semiconductor layer 250 may include inorganic semiconductor nanostructures, such as nanocrystals (quantum dots), nanorods, nanowires, and/or nanosheets. Such inorganic semiconductor nanostructures may be constructed of CdS, CdSe, PbSe, InAs, InP, and/or InSb and/or any other suitable alloy and/or element. The nanostructured semiconductor layer 250 is positioned on, and in physical contact with, an alkyl ammonium metal halide perovskite layer 240.

FIG. 2 also illustrates other elements that may be included in a device 200. Starting from the bottom, and in order, a device 200 may include a transparent substrate layer 210 and a transparent conducting oxide layer 220 positioned on the transparent substrate layer 210. The transparent conducting oxide layer 220 may be, for example, a fluorine-doped tin oxide layer. A device 200 may also include an electron transport layer (ETL) 230 positioned on the transparent conducting oxide layer 220, upon which may be positioned the alkyl ammonium metal halide perovskite layer 240 and then the nanostructured semiconductor layer 250. A device 200 may also include a hole transport layer (HTL) 260 positioned on the nanostructured semiconductor layer 250, and finally may include a conducting layer 270 positioned on hole transport layer 260. An example of an electron transport layer 230 includes titanium dioxide. An example of a hole transport layer 260 is a layer that includes spiro-MeOTAD. Other examples of materials for a hole transport layer 260 include polyhexyl (3-thiophene), other semiconducting polymers, and/or inorganic oxides such as NiO and/or $MoO_3$. Examples of a conducting layer 270 include silver, gold, and/or copper.

Figure 3A:
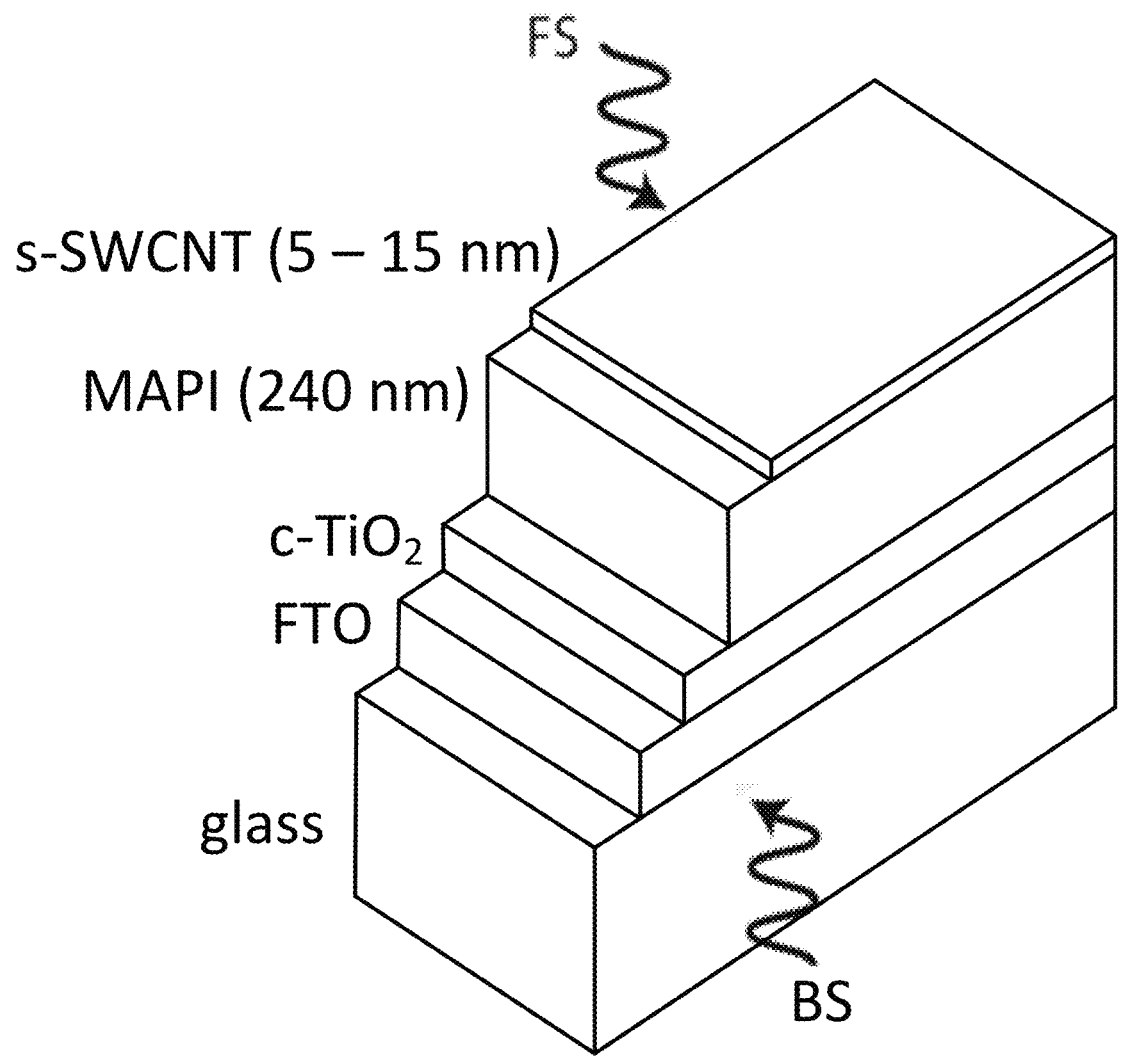
FIG. 3a illustrates a $TiO_2$/$MAPbI_3$/SWCNT trilayer device with the excitation directions indicated for "backside" (BS) and "frontside" (FS) illumination, according to some embodiments of the present disclosure; $MAPbI_3$ (methyl ammonium lead iodide); SWCNT (single-walled carbon nanotubes).
Figure 3B:
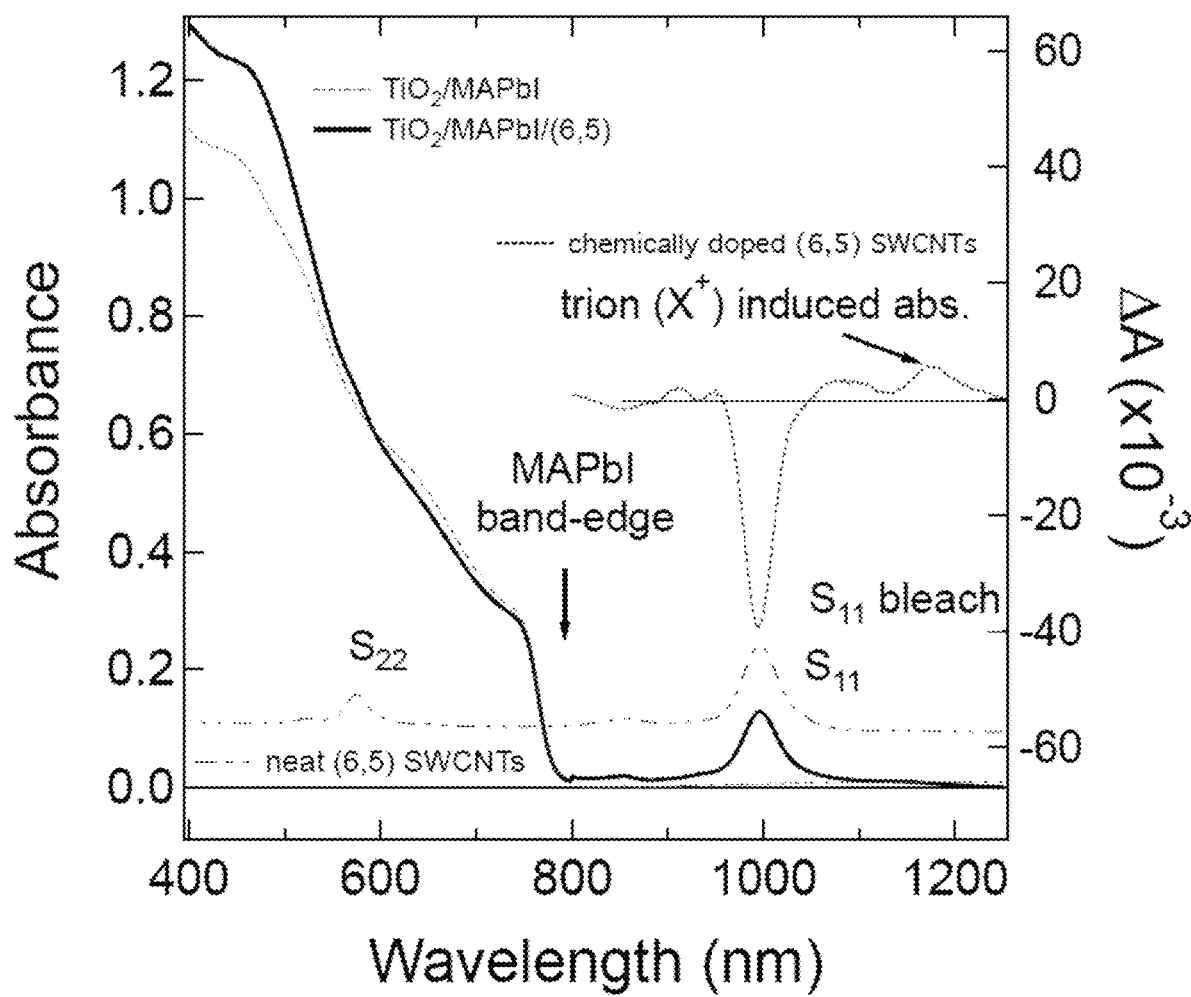
FIG. 3b illustrates optical absorption spectra (corrected for reflection in an integrating sphere) for $TiO_2$/$MAPbI_3$ and $TiO_2$/$MAPbI_3$/(6,5) samples, along with a neat 9 nm (6,5) SWCNT film for comparison, according to some embodiments of the present disclosure. The first and second excitonic transition of the s-SWCNTs ($S_{11}$ and $S_{22}$) are labeled. The offset spectrum is the differential absorption spectrum for a chemically doped (p-type) (6,5) SWCNT film.
Figure 3C:
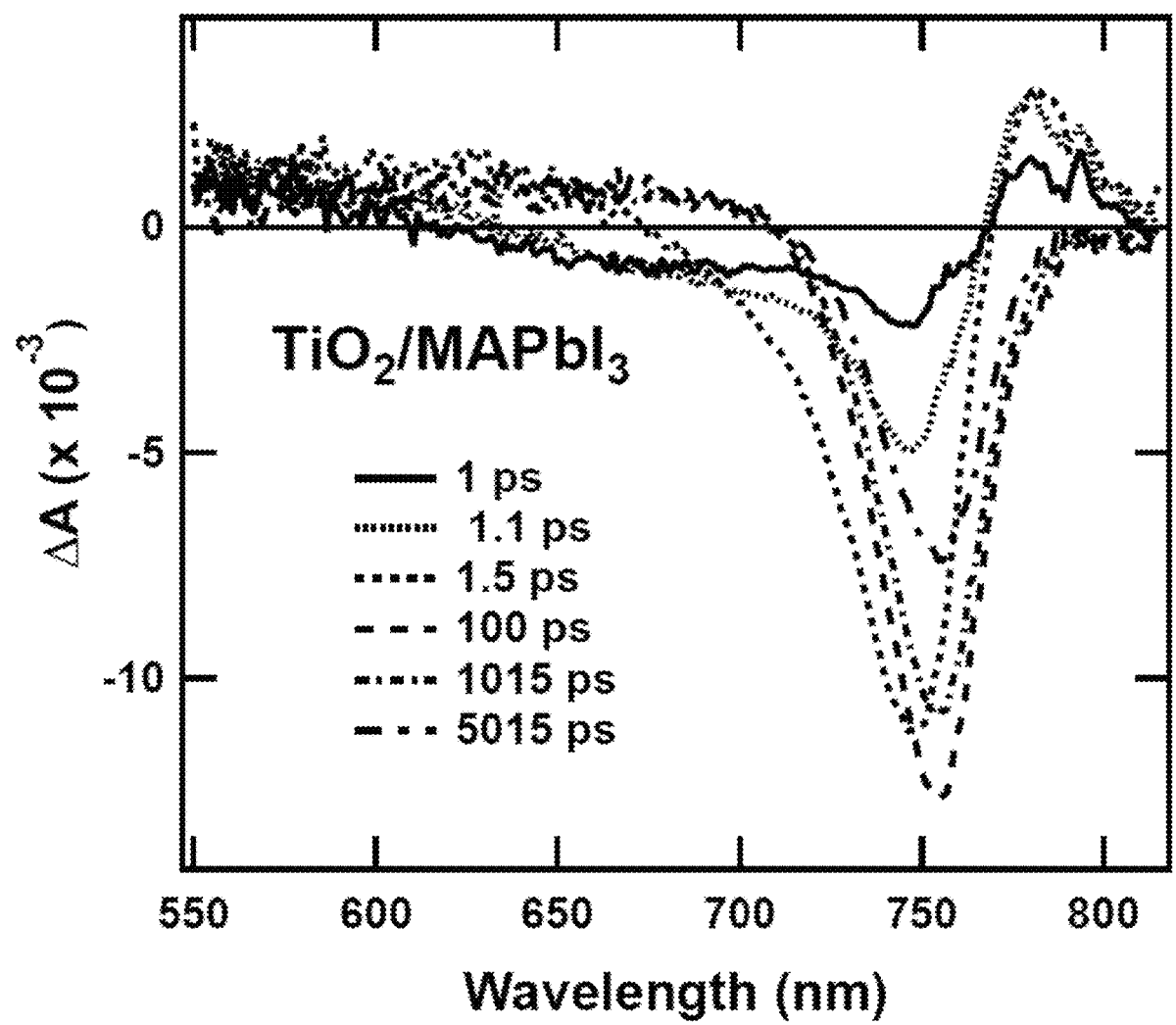
FIGS. 3c and 3e illustrate TA spectra for a $TiO_2/MAPbI_3$ bilayer at various temporal delays, according to some embodiments of the present disclosure.
Figure 3D:
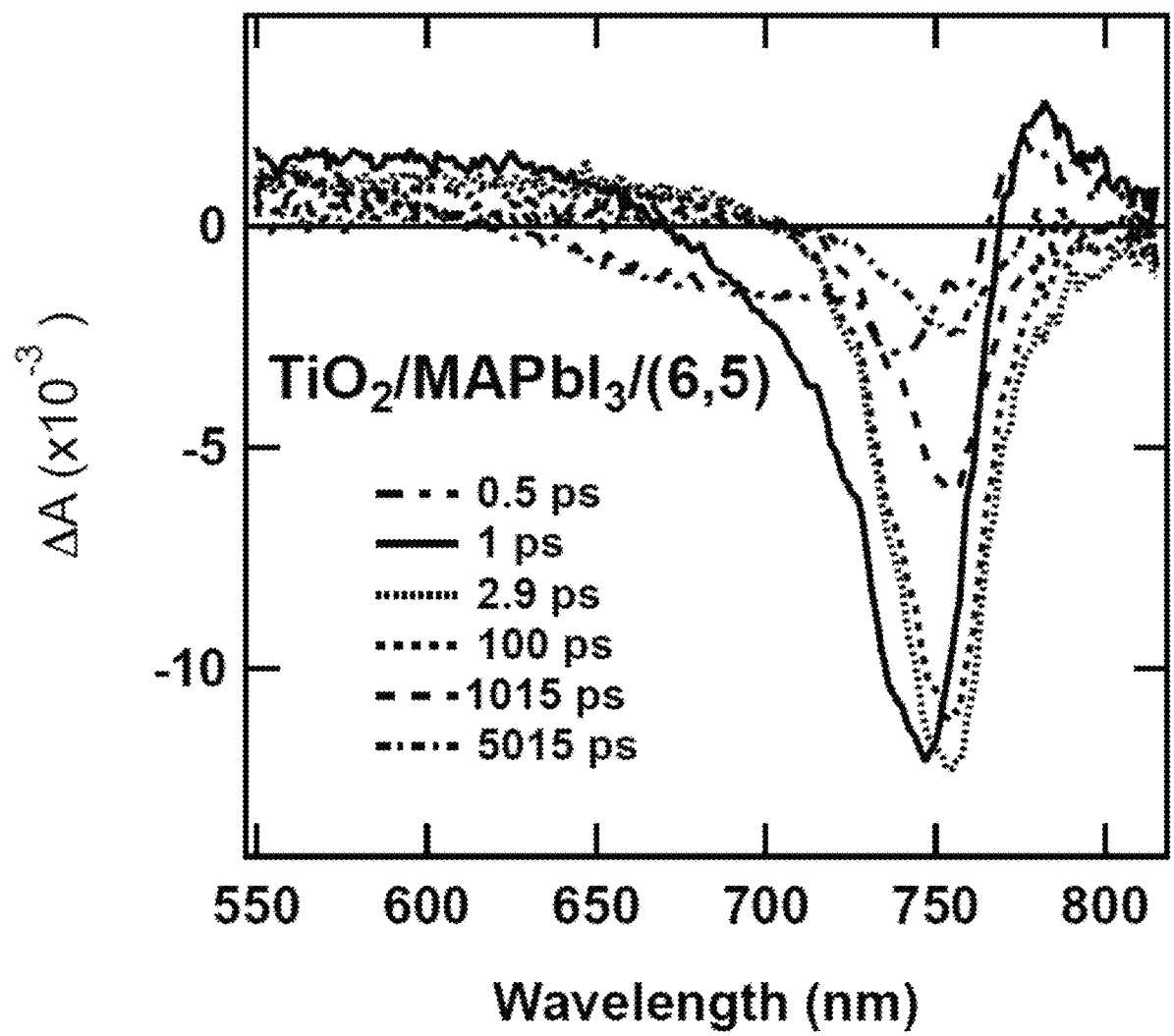
FIGS. 3d and 3f illustrate TA spectra for $TiO_2/MAPbI_3/$ (6,5) trilayer at various pump-probe delays, according to some embodiments of the present disclosure.
Figure 3E:
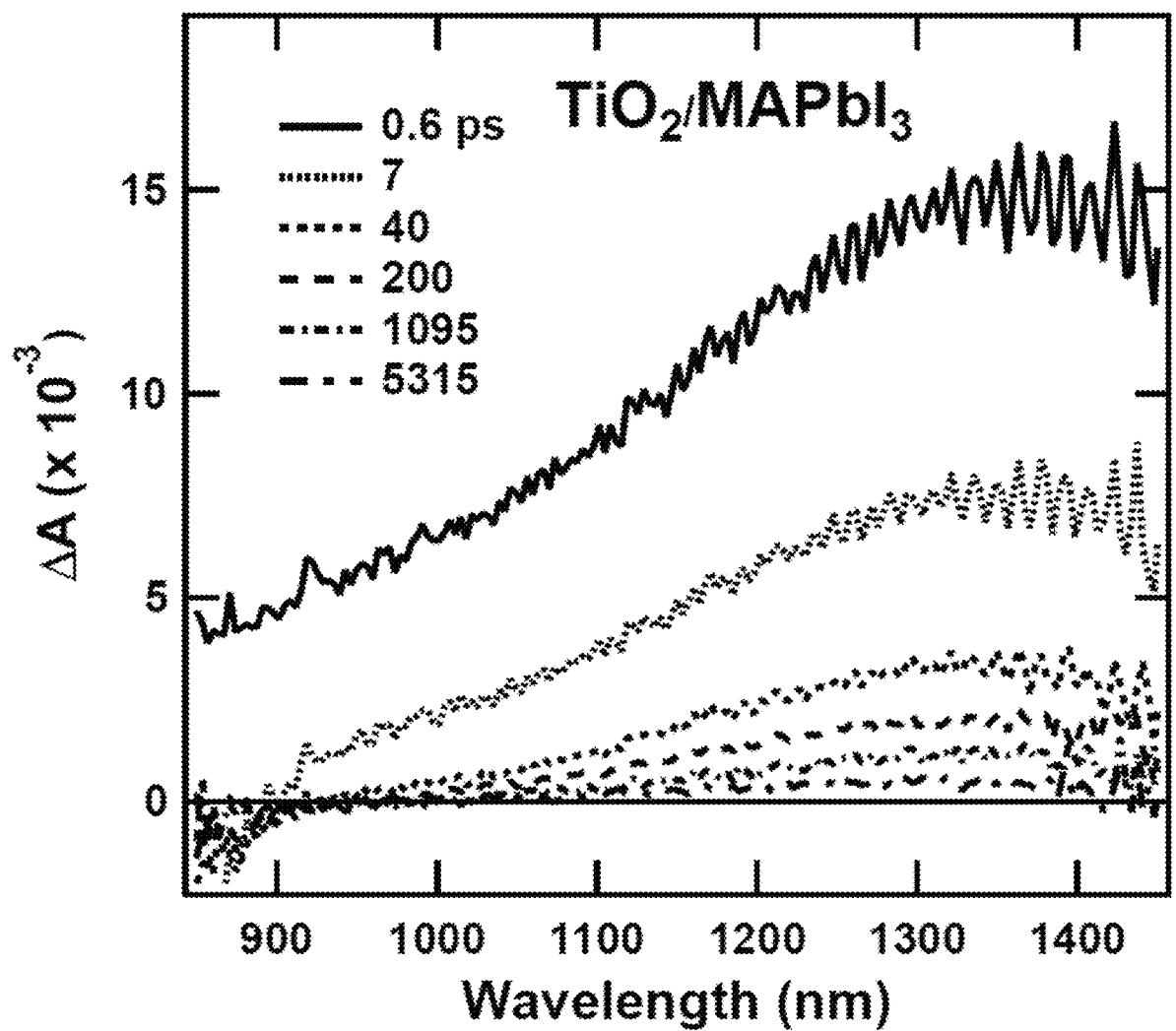
Figure 3F:
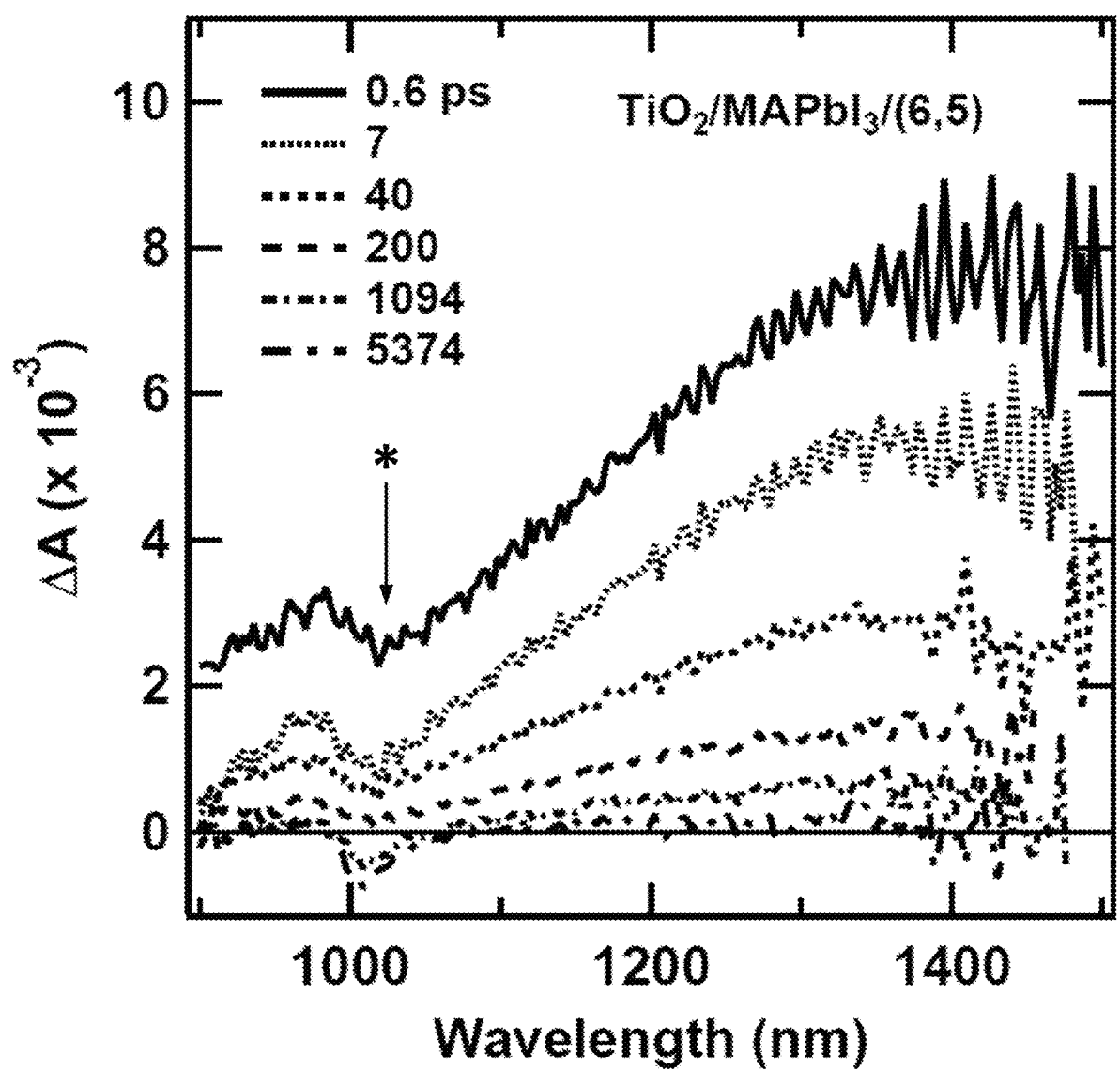

FIG. 3a illustrates a representative schematic of one of the primary trilayer stacks used for the time-resolved spectroscopic studies described herein—$MAPbI_3$ interfaced with both an ETL (compact $TiO_2$) and HTL (s-SWCNT). The HTL studies described herein focused primarily on near-monochiral (6,5) s-SWCNT thin films and lithium-doped spiro-MeOTAD. The (6,5) s-SWCNT HTL was enriched with >99% semiconducting SWCNTs by a polyfluorene extraction procedure, and was constructed almost entirely of (6,5) s-SWCNTs (>95%). FIG. 3b displays absorbance spectra (corrected for reflectance) of three films studied herein. The solid trace shows $MAPbI_3$ deposited on a compact $TiO_2$ (bilayer) and the dashed trace shows an identical bilayer stack capped with a 9 nm (6,5) s-SWCNT HTL (trilayer). The primary difference between the two spectra is the presence of a sharp transition at approximately 1000 nm, corresponding to the first excitonic transition ($S_{11}$) of the (6,5) s-SWCNTs (see lower dashed trace). The offset spectrum in FIG. 3b shows a differential absorption spectrum ($\Delta A = A_{doped} - A_{undoped}$) for a (6,5) s-SWCNT film doped p-type with a well-characterized one-electron oxidant. The spectrum is dominated by two key peaks—a strong bleach of the $S_{11}$ exciton at 1000 nm and an induced absorption (IA) at 1170 nm, the latter having been assigned to the optical transition of a three-body trion quasiparticle. Importantly, the differential spectrum in FIG. 3b demonstrates that two distinct spectral signatures may be used to follow hole extraction into the (6,5) s-SWCNT HTL.

Femtosecond TA spectra are shown in FIGS. 3c-f for a $TiO_2/MAPbI_3$ bilayer (FIGS. 3c/3e) and a $TiO_2/MAPbI_3/(6,5)$ trilayer (FIGS. 3d/3f) with backside illumination (FIG. 3a) at 400 nm. In the region of 550-800 nm, the bleach at 750 nm corresponds to a bleach of the $MAPbI_3$ band-edge excitonic transition. While the initial excited state was excitonic, the exciton rapidly (<50 fs) decayed into uncorrelated charges due to the low exciton binding energy (ca. 9-16 meV). A broad induced absorption (IA) appeared between 850-1400 nm for both samples, and is related to charge carriers in $MAPbI_3$. However, the trilayer sample has a sharp bleach centered at approximately 1000 nm (asterisk, FIG. 3f), corresponding to the (6,5) $S_{11}$ transition, superimposed on this broad IA. The (6,5) bleach was present at early times, prior to 1 ps delay, indicating very rapid hole transfer, and remained for the entire experimental window (approximately 5 ns).

Figure 4A:
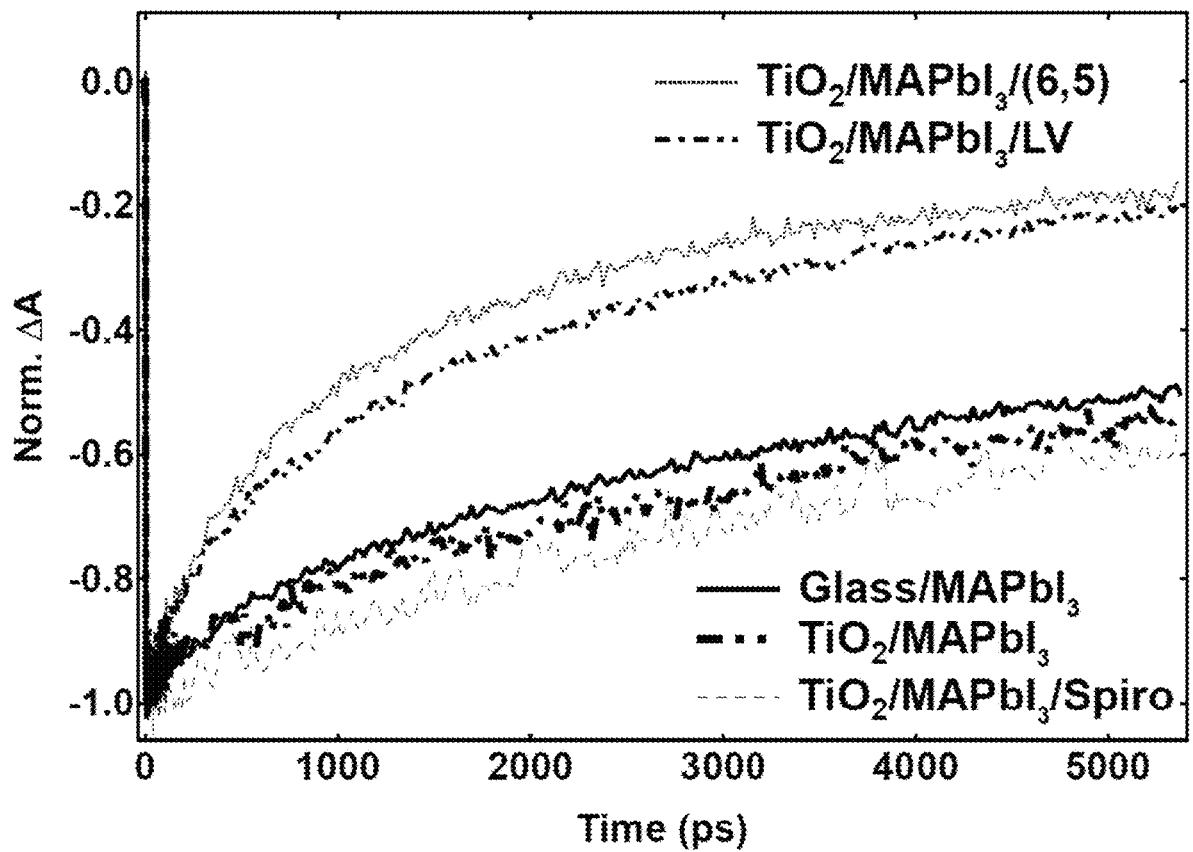
FIG. 4a illustrates transient absorption dynamics of s-SWCNT hole extraction, specifically MAPI bleach recovery dynamics, measured at 750 nm for five different samples, according to some embodiments of the present disclosure. The excitation wavelength was 400 nm, backside illumination.

FIG. 4a shows the TA dynamics of several different samples probed at the $MAPbI_3$ band-edge bleach (750 nm).

Figure 5:
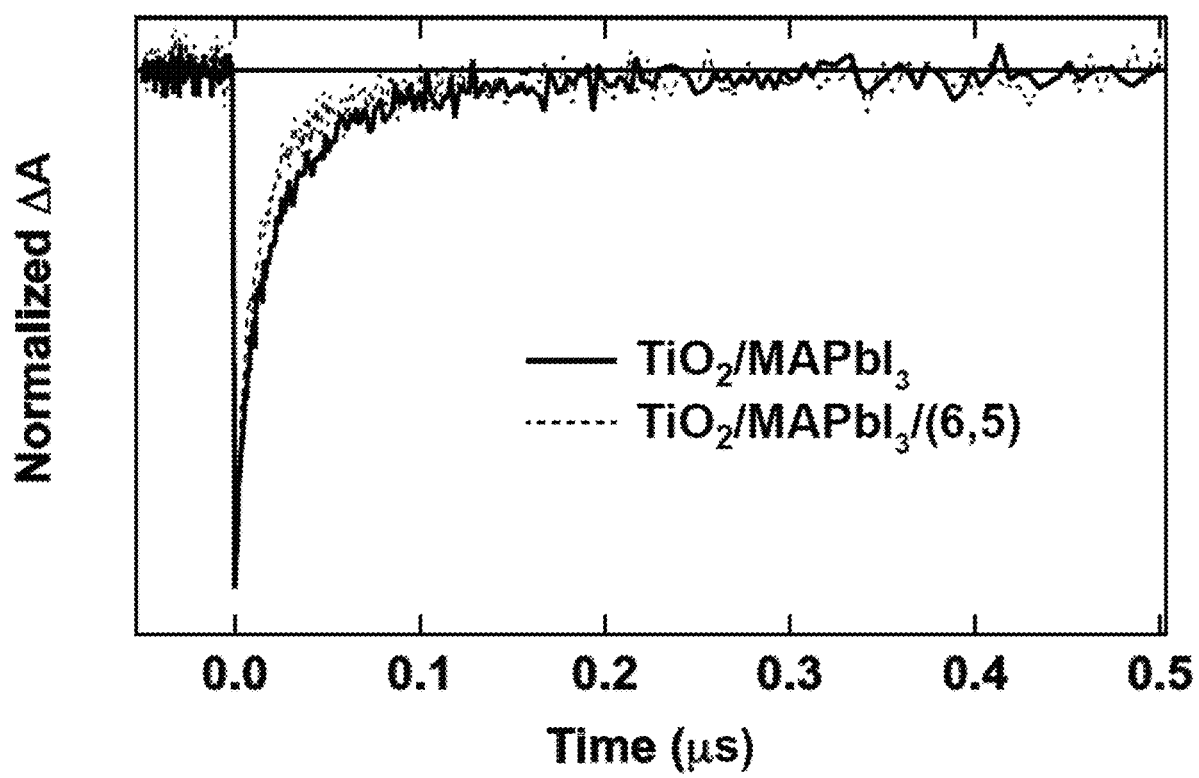
FIG. 5 illustrates a comparison of normalized kinetics at 750 nm for samples pumped at 400 nm over the first 500 ns, according to some embodiments of the present disclosure.
Figure 6:
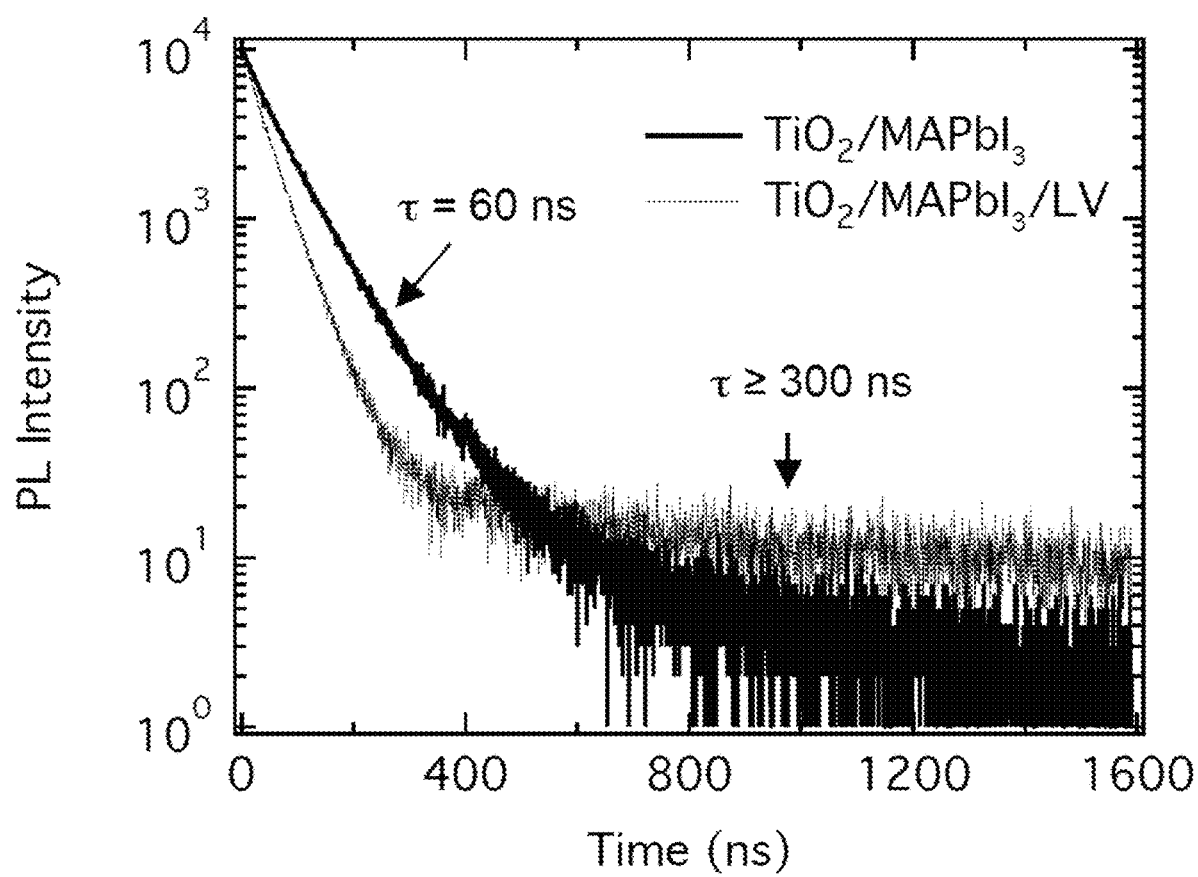
FIG. 6 illustrates time-resolved PL (tr-PL) transients for a $TiO_2/MAPI$ bilayer sample and a $TiO_2/MAPI/(6,5)$-SWCNT trilayer sample, according to some embodiments of the present disclosure. The long time constant in the $TiO_2/MAPbI_3/LV$ sample may represent delayed fluorescence from the recombination process where carriers are slow transferred from the ETL and HTL back into the $MAPbI_3$ layer.

Since no HTL or ETL was present for the MAPbI$_3$/glass sample, the bleach recovery dynamics represent intrinsic electron-hole recombination dynamics within the neat perovskite (where "alkyl ammonium metal halide perovskite" is shortened to "perovskite"). Interestingly, the dynamics for TiO$_2$/MAPbI$_3$ and TiO$_2$/MAPbI$_3$/spiro were essentially identical to the MAPbI$_3$/glass sample, indicating that the bleach dynamics for both of the former samples are dominated by electron-hole recombination within the perovskite. The dynamics of the MAPbI$_3$ absorber layer on TiO$_2$ can be fit empirically with a biexponential decay with two characteristic time constants in the range of 8 ns and 50 ns (FIG. 5, $<\tau>=42$ ns). The longer time constant is consistent with the photoluminescence (PL) lifetime ($\tau_{PL}=60$ ns) extracted from time-resolved PL measurements (see FIG. 6), which is attributed to monomolecular (Shockley-Read-Hall) non-radiative recombination.

Figure 4B:
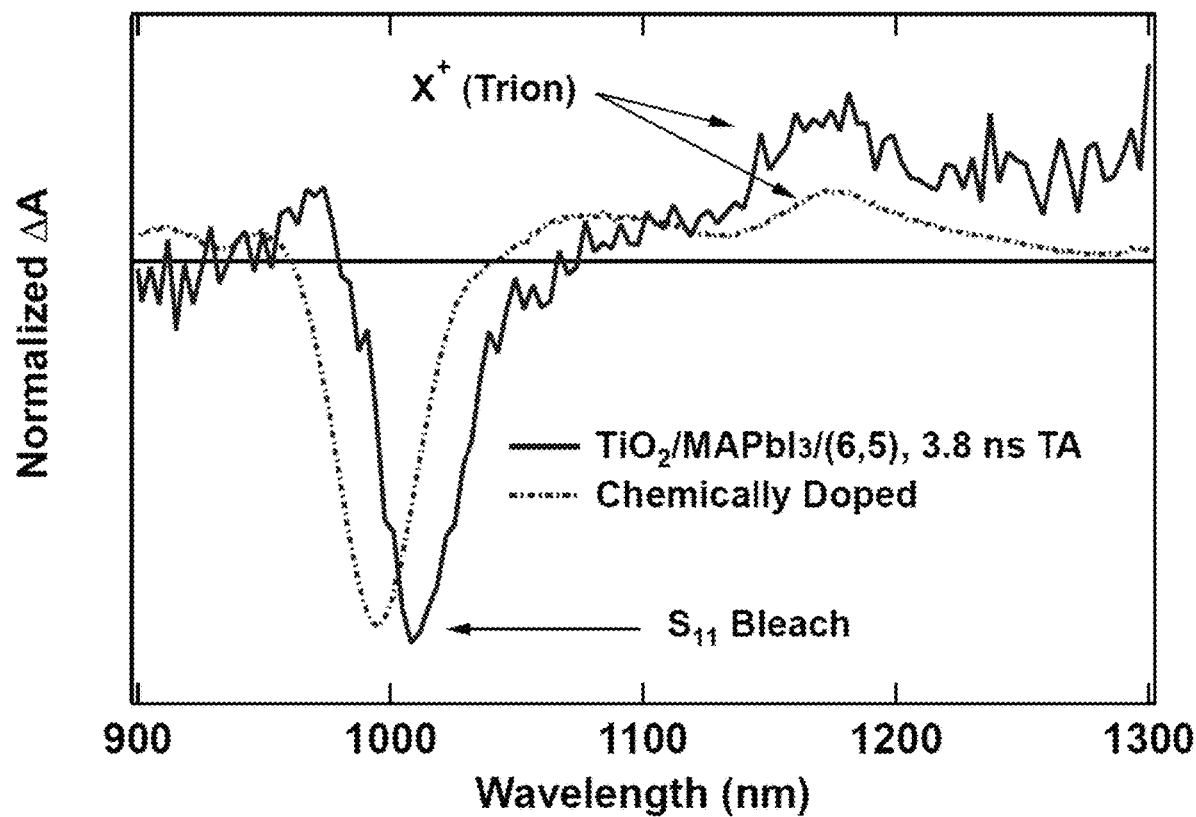
FIG. 4b illustrates a comparison of the TA spectrum of a $TiO_2/MAPI/(6,5)$ trilayer at a delay of 3.8 ns to the differential spectrum of a chemically doped (6,5) film, according to some embodiments of the present disclosure. The excitation wavelength was 400 nm, backside illumination.
Figure 7A:
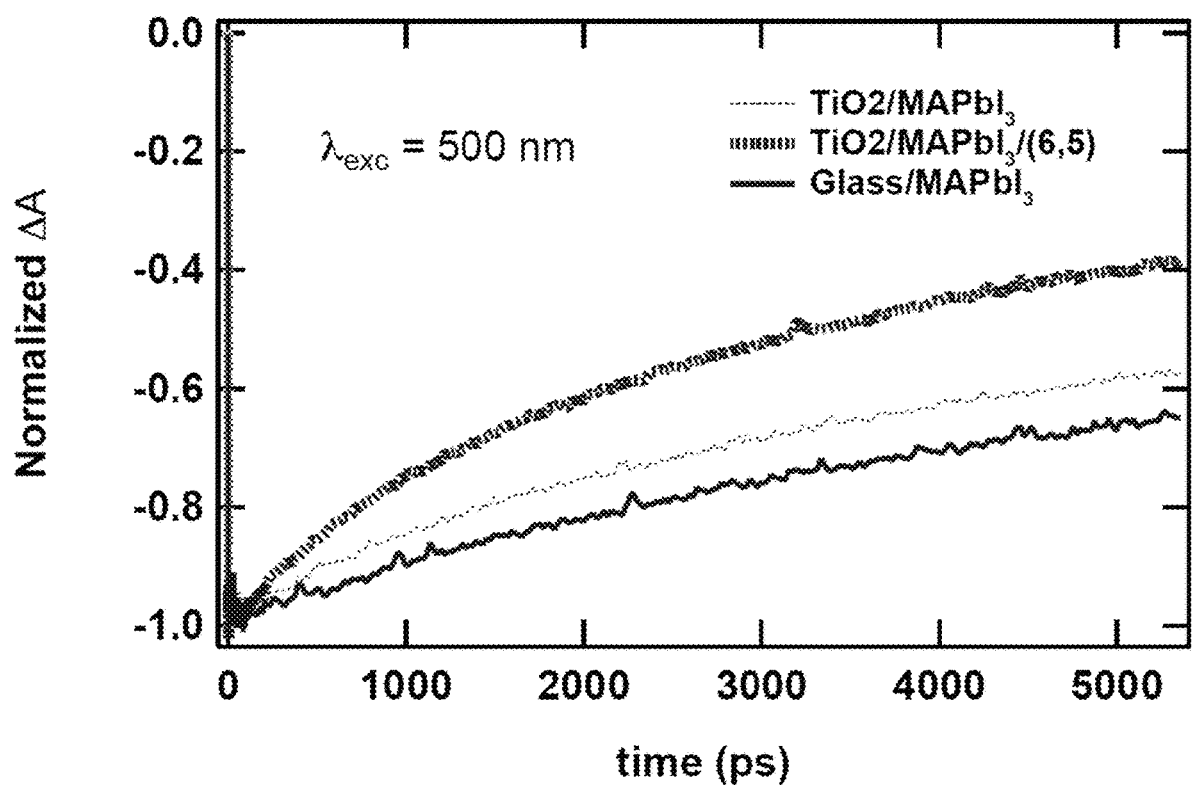
FIGS. 7a and 7b illustrate a comparison of kinetics at 750 nm for samples pumped at 700 nm (FIG. 7a) and 500 nm (FIG. 7b), according to some embodiments of the present disclosure. Samples with the (6,5) SWCNT HTL exhibit faster bleach recovery than those without the (6,5) HTL.
Figure 7B:
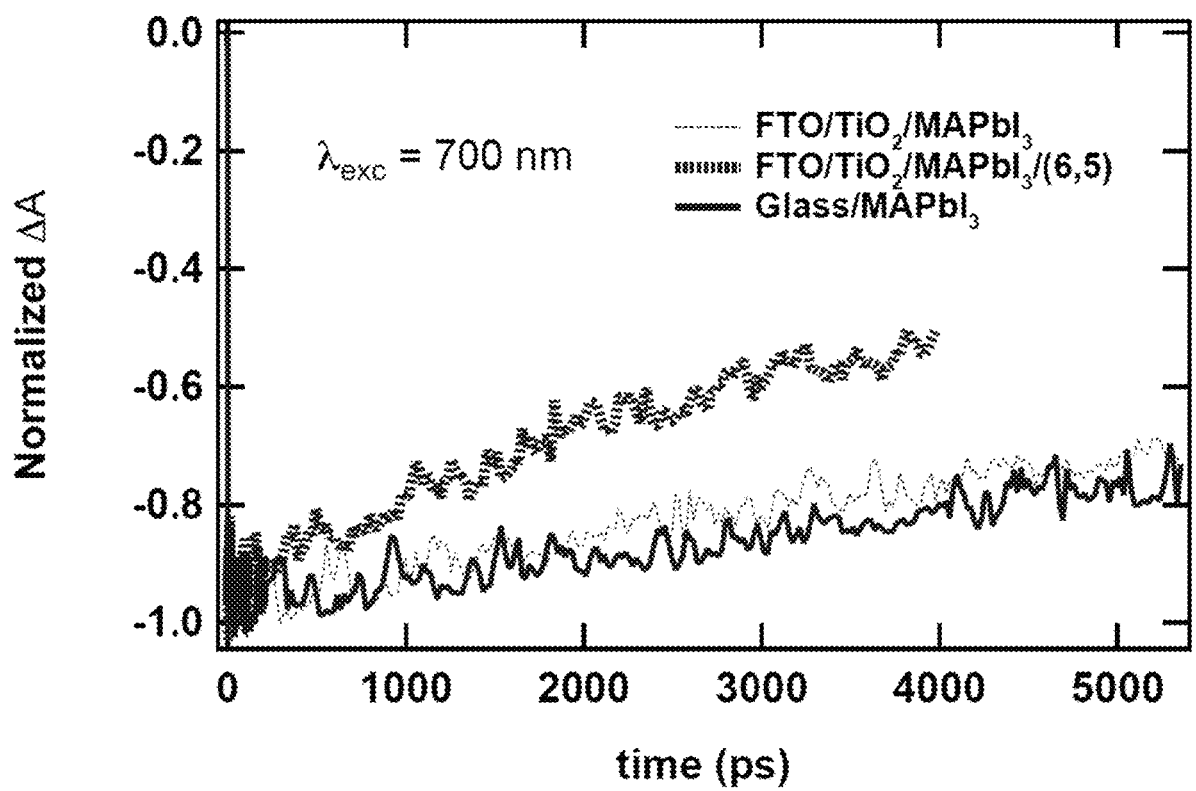

In sharp contrast, the TiO$_2$/MAPbI$_3$/(6,5) sample showed much more rapid bleach recovery, indicating a new kinetic pathway where the s-SWCNT HTL removed charge carriers from the perovskite layer. The TA spectrum at a pump-probe delay of 3.8 ns is compared in FIG. 4b to the chemically doped p-type (6,5) thin film. The two charge-related features, the s-SWCNT S$_{11}$ bleach at 1000 nm and the s-SWCNT trion at 1170 nm, provide unambiguous evidence for hole extraction from the perovskite layer into the adjacent s-SWCNT HTL. FIGS. 7a and 7b demonstrate that similar results were obtained for excitation at higher wavelength (e.g. 500 nm and 700 nm respectively). Additionally, FIG. 4a shows that an HTL composed of laser vaporization (LV) s-SWCNTs, with significantly different band gaps, also efficiently extracted holes from the perovskite layer.

Figure 4C:
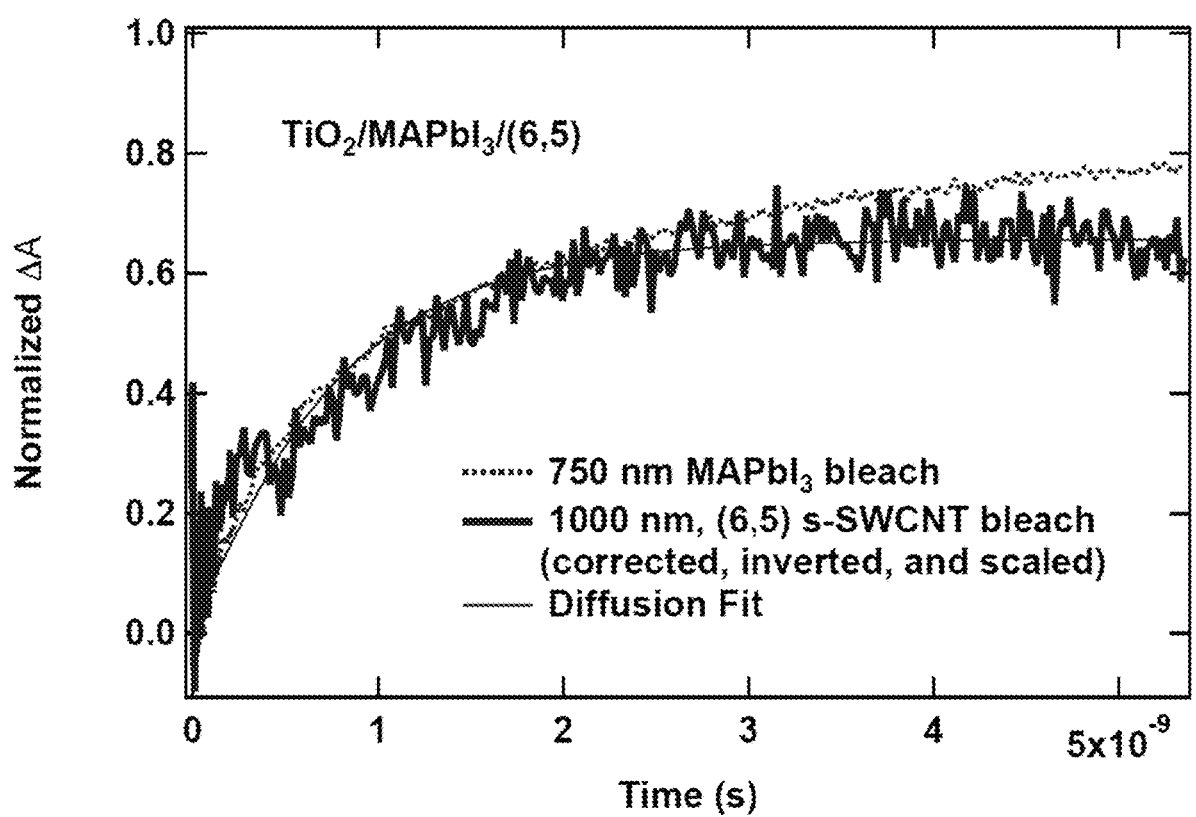
FIG. 4c illustrates an inverted, corrected and rescaled transient of $S_{11}$ exciton bleach (1000 nm) for a $TiO_2/MAPbI_3/(6,5)$ trilayer compared to a $MAPbI_3$ band edge bleach (750 nm), according to some embodiments of the present disclosure. The excitation wavelength was 400 nm, backside illumination.

For the (6,5) trilayer sample, comparison of the rise time of the S$_{11}$ bleach (corrected for the superimposed MAPbI$_3$ IA and inverted) to the MAPbI$_3$ bleach recovery (see FIG. 4c) demonstrates that both transients reflect the same kinetic process of hole extraction into the (6,5) SWCNT HTL. This bleach slowly rose over the 5 ns experimental window, indicating a diffusion-limited arrival of holes at the MAPbI$_3$/s-SWCNT interface. The near-identical kinetics of the (6,5) bleach growth and the MAPbI$_3$ bleach decay over the first approximately 3 ns indicate that the primary charge extraction process occurring over this temporal window was hole extraction into the HTL. At a delay of approximately 3 ns, the growth of the (6,5) S$_{11}$ bleach was complete, implying that (1) diffusion of holes to the SWCNT HTL and subsequent hole extraction was complete after approximately 3 ns, (2) the remaining signal at approximately 3 ns and beyond for the 750 nm MAPbI$_3$ bleach was primarily or completely due to electrons, and (3) longer delays are required to follow either electron extraction by TiO$_2$ or recombination of extracted charges. The slow rise of the (6,5) S$_{11}$ bleach was fitted to extract the kinetics of hole diffusion to this interface (thin solid trace, FIG. 4c). This fit utilizes an analytical solution to the diffusion equation with an average lifetime of approximately 42 ns for holes in the MAPbI$_3$ layer. The fit yields a hole diffusion constant of 0.3 cm$^2$/s and a diffusion length of approximately 1 μm for holes in the MAPbI$_3$ layer.

Figure 4D:
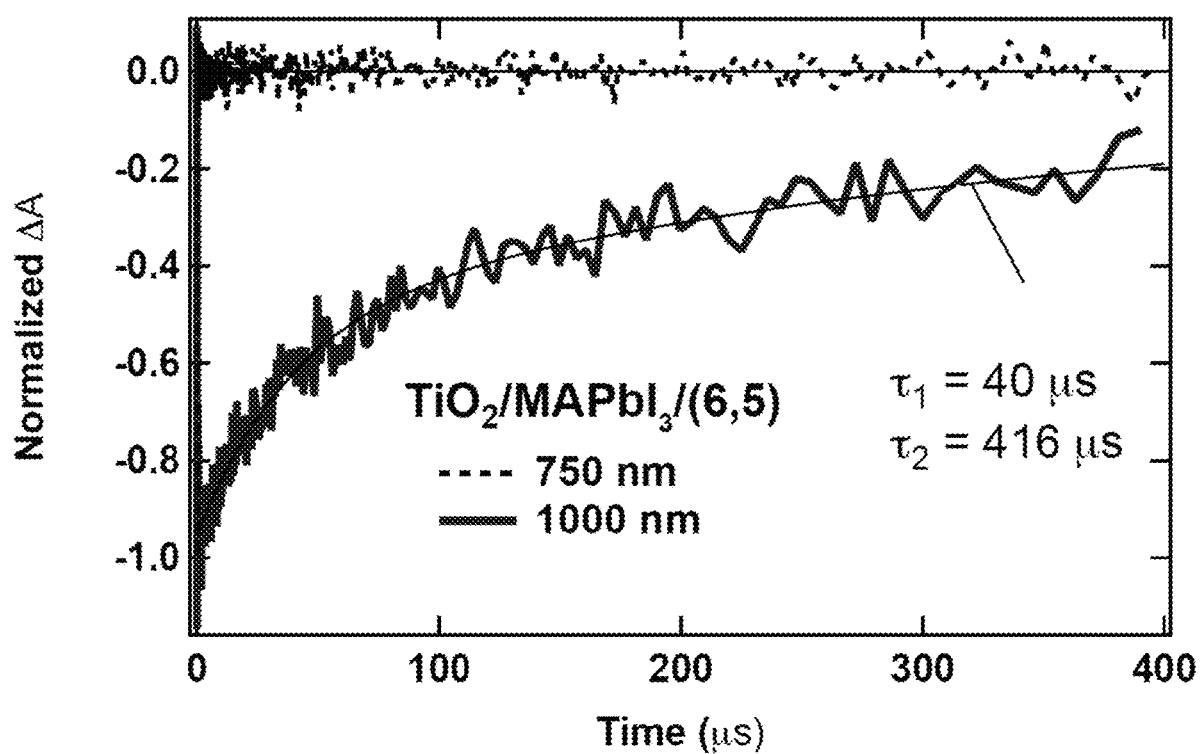
FIG. 4d illustrates long-delay dynamics of MAPI bleach recovery (750 nm) and (6,5) $S_{11}$ bleach recovery (1000 nm) for a $TiO_2/MAPI/(6,5)$ trilayer, according to some embodiments of the present disclosure. The solid line shows an exponential fit to the $S_{11}$ bleach recovery, with $\tau_1$=40 µs and $\tau_2$=416 µs. The excitation wavelength was 400 nm, backside illumination.
Figure 8A:
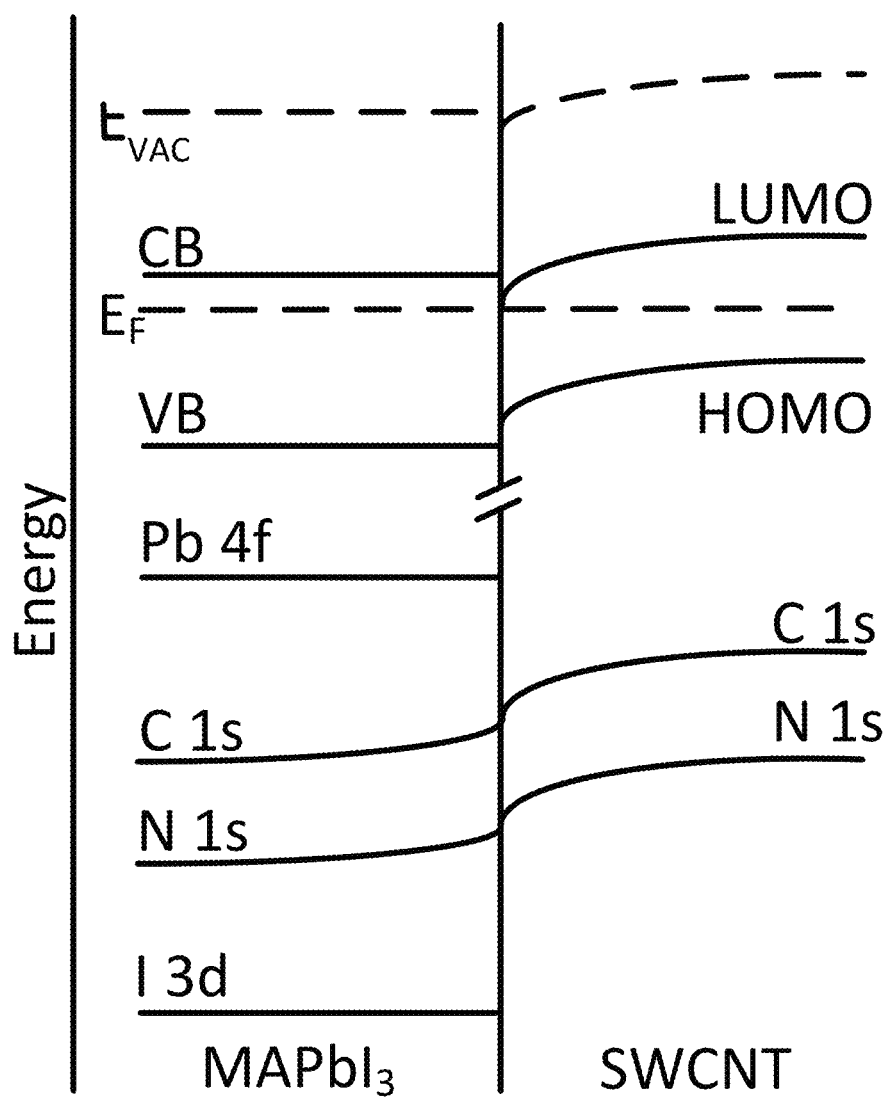
FIGS. 8a and 8b illustrate a summary of the interfacial band alignment obtained by photoelectron spectroscopy measurements for a MAPI/(6,5)-SWCNT interface (FIG. 8a), and a MAPI/spiro interface (FIG. 8b), according to some embodiments of the present disclosure. Note the opposite direction of band bending for each HTL, and that the band bending within the SWCNT HTL should provide an energetic barrier for back-transfer of holes to the MAPI valence band.
Figure 8B:
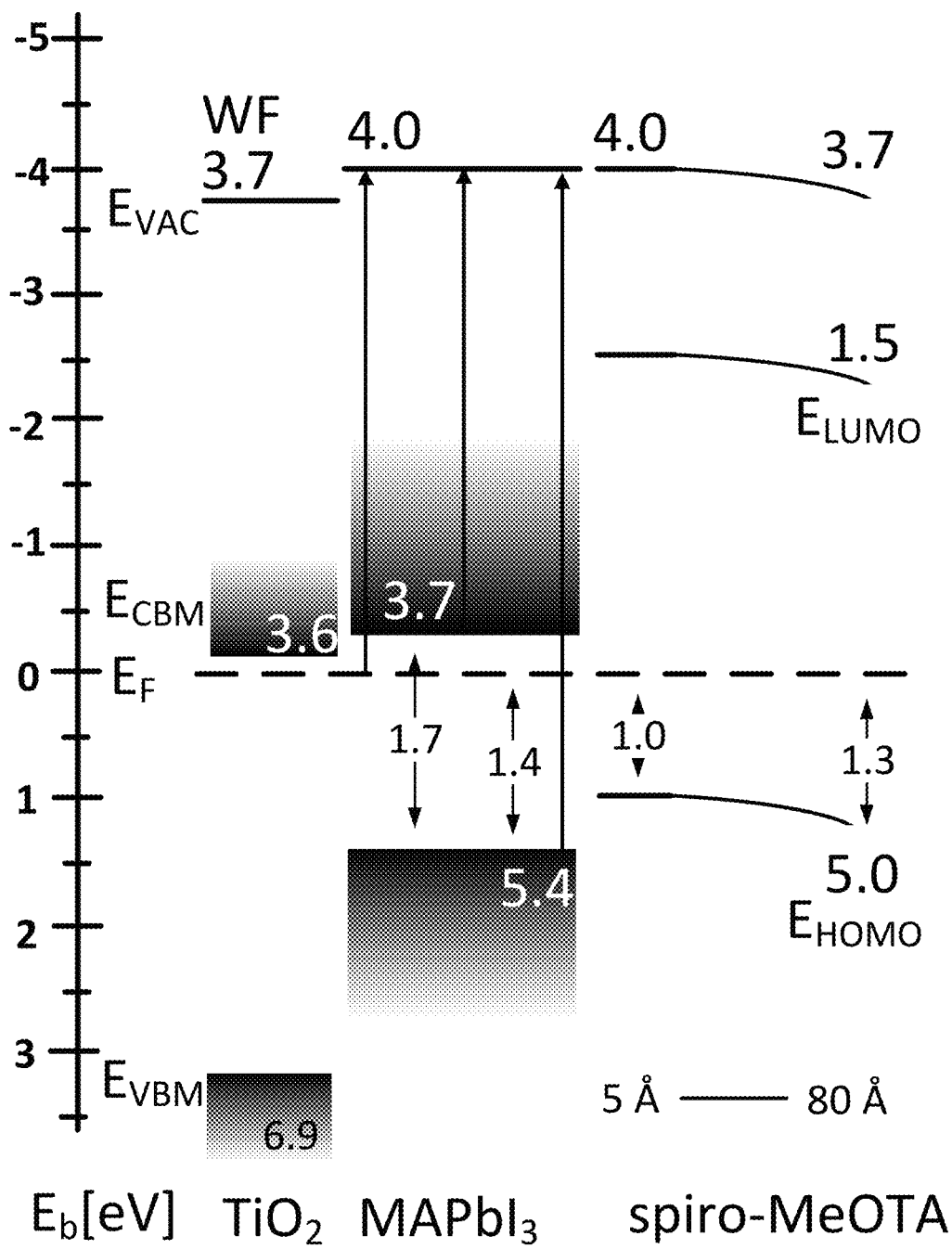

The electronic delay on the TA spectrometer used enabled carrier recombination in the TiO$_2$/MAPbI$_3$/(6,5) trilayer over a 400 μs time window to be probed (see FIG. 4d). The MAPbI$_3$ bleach (750 nm) decayed relatively quickly, and was fully recovered by about 400 ns, indicating that both electrons and holes were fully removed from the perovskite over this time frame. In stark contrast, the (6,5) S$_{11}$ bleach (1000 nm) was extremely long-lived, and can be fit by a biexponential decay ($\tau_1=40$ μs and $\tau_1=416$ μs, thick solid line). FIG. 4d demonstrates that once holes were extracted by the SWCNT HTL, the resulting charge-separated state was extremely long-lived. PES measurements suggest that ground-state interfacial charge transfer induced an appreciable barrier of ca. 300 meV to the back-transfer of holes from s-SWCNTs to the perovskite (see FIGS. 8a and 8b). This suggests that the very slow loss of holes in the s-SWCNT HTL (see FIG. 4d) is a beneficial result of this band bending within the s-SWCNT film. It is informative to compare the demonstrably efficient hole extraction of the s-SWCNT HTL over a 4 ns time window with the apparently inefficient extraction by the traditionally used spiro-MeOTAD HTL (see FIG. 4a). For a similarly prepared MAPbI$_3$/spiro-MeOTAD interface, it has been demonstrated by PES that band bending within the spiro film shows an opposite trend of that found in a s-SWCNT HTL (see FIGS. 8a and 8b). Thus, in contrast to the s-SWCNT HTL, the band bending in the spiro-MeOTAD HTL should not inherently promote movement of holes into the bulk of the transport layer and inhibition of back-transfer to the perovskite layer.

Figure 9A:
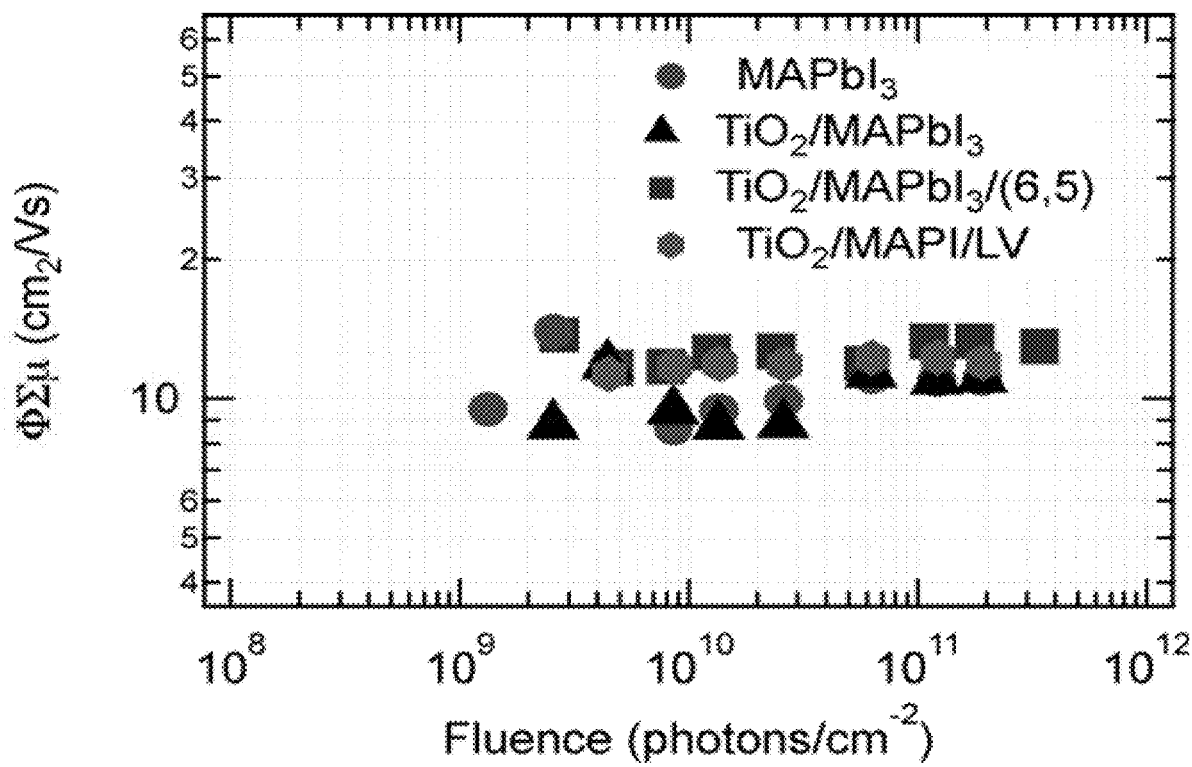
FIGS. 9a and 9b illustrate TRMC results for $MAPbI_3$ films with various electron and hole transport layers, according to some embodiments of the present disclosure.
Figure 9B:
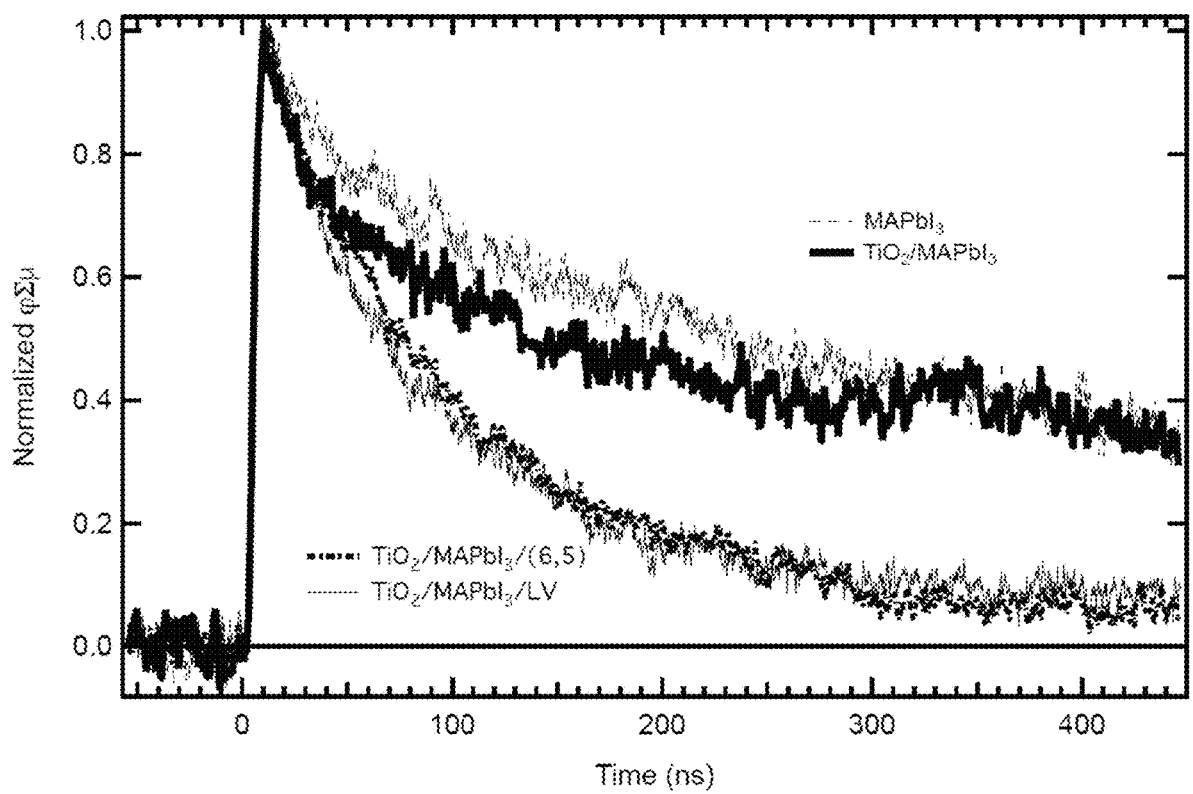

To probe electron injection into TiO$_2$, the time-resolved microwave conductivity (TRMC) was studied as a sensitive probe of free charge carriers (see FIGS. 9a and 9b). In the TRMC measurement, the change in microwave probe power (ΔP/P) is proportional to the yield of free charge carriers (Φ) multiplied by the sum of the carrier mobilities ($\Sigma\mu=\mu_e+\mu_n$): ΔP/P α ΦΣμ. The quantity of the yield-mobility product (ΦΣμ) is used as a figure of merit to compare the charge generation efficiency amongst various samples, with the caveat that the mobility of carriers in all components (e.g. absorber layer, ETL, HTL, etc.) should be considered. The fluence dependence and temporal evolution of ΦΣμ for four different MAPbI$_3$ samples is shown in FIGS. 9a and 9b. FIG. 9a shows that ΦΣμ for all samples follows the same general trend with fluence, with an average value of approximately 10 cm$^2$/Vs. This yield-mobility product is over an order of magnitude higher than ΦΣμ obtained for high internal quantum efficiency (ca. 70%) charge generation in s-SWCNT/C$_{60}$ donor/acceptor heterojunctions. This large difference in ΦΣμ suggests that the observed photoconductance is dominated by carrier(s) in the perovskite layer. Since TA measurements demonstrate that hole transfer to s-SWCNTs is complete by 3 ns, comparable to the pulse duration for the TRMC measurements, the similar yield-mobility products of the TiO$_2$/MAPbI$_3$ and TiO$_2$/MAPbI$_3$/s-SWCNT suggest that the dominant carrier that contributes to ΦΣμ is the perovskite electron (since removal of the hole does not affect ΦΣμ). If ΦΣμ is considered to be dominated by the perovskite electron, then the similar yield-mobility products of the quartz/MAPbI$_3$ and TiO$_2$/MAPbI$_3$ samples suggest that negligible electron density is injected from MAPbI$_3$ into the TiO$_2$ ETL over the 4 ns TRMC pulse.

The TRMC transients for the same four samples are plotted in FIG. 9b. The TRMC dynamics are similar for MAPbI$_3$ and TiO$_2$/MAPbI$_3$, suggesting that, in the absence of the s-SWCNT HTL, electron extraction by the compact TiO$_2$ ETL is inefficient even over a time frame of about 450 ns. In sharp contrast, samples with a s-SWCNT HTL exhibit significantly faster decay, corresponding to electron extraction (presumably diffusion-limited) over the 450 ns window. Similar to TA dynamics, the TRMC transient for the trilayer with an LV s-SWCNT HTL are commensurate with the (6,5) s-SWCNT HTL, suggesting that a broad range of s-SWCNTs with different band gaps can be used to enhance the charge extraction kinetics from the alkyl ammonium metal halide perovskite layer.

These results demonstrate that improved electron extraction can be achieved not only by the direct employment of an interfacial layer at the ETL interface, but also by better extraction of holes at the HTL interface. FIG. 9b demonstrates that once holes are efficiently removed by the s-SWCNT HTL within about 3 ns, the concomitant increase of the quasi-Fermi level in the (now n-type) MAPbI$_3$ can provide the needed driving force for electron injection into the TiO$_2$ ETL. This result indicates that the rates for carrier extraction are dynamically dependent upon the configuration of interfaces within the device stack.

Figure 10A:
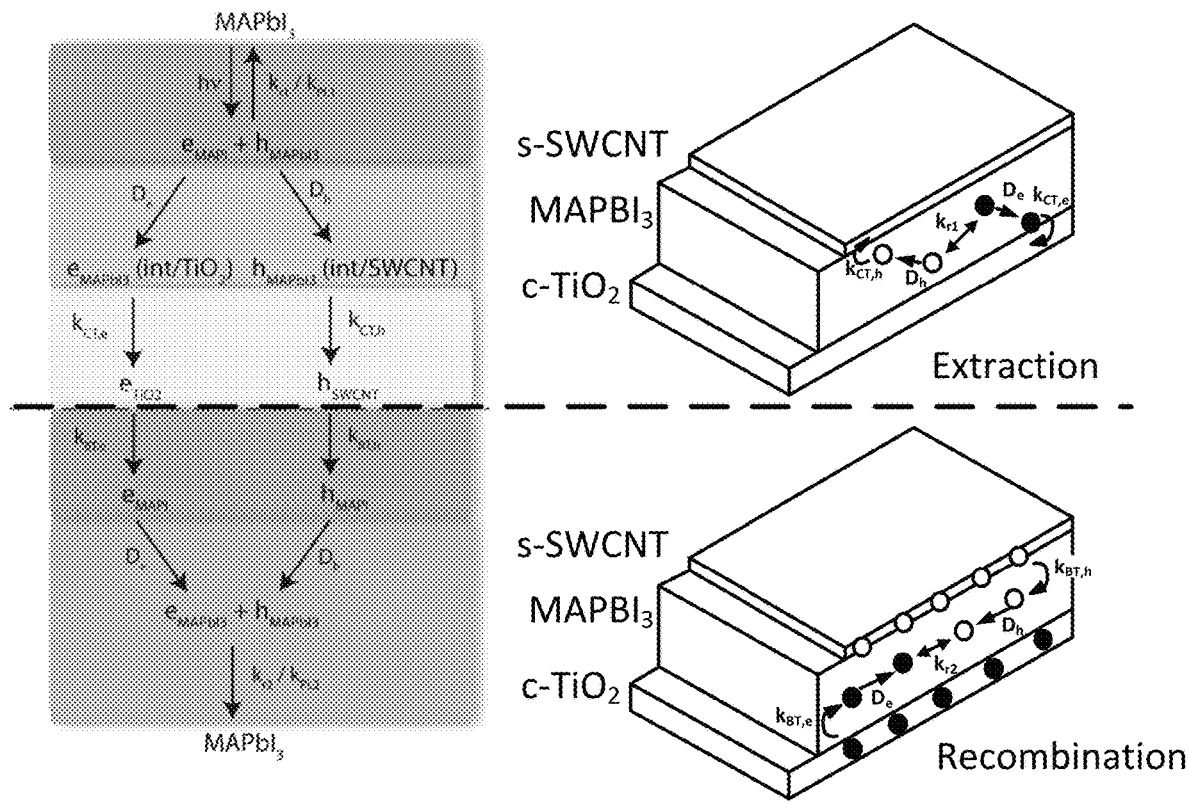
FIGS. 10a and 10b illustrate a summary of important dynamic processes occurring within MAPI and at the interfaces with the SWCNT HTL and $TiO_2$ ETL, according to some embodiments of the present disclosure.
Figure 10B:
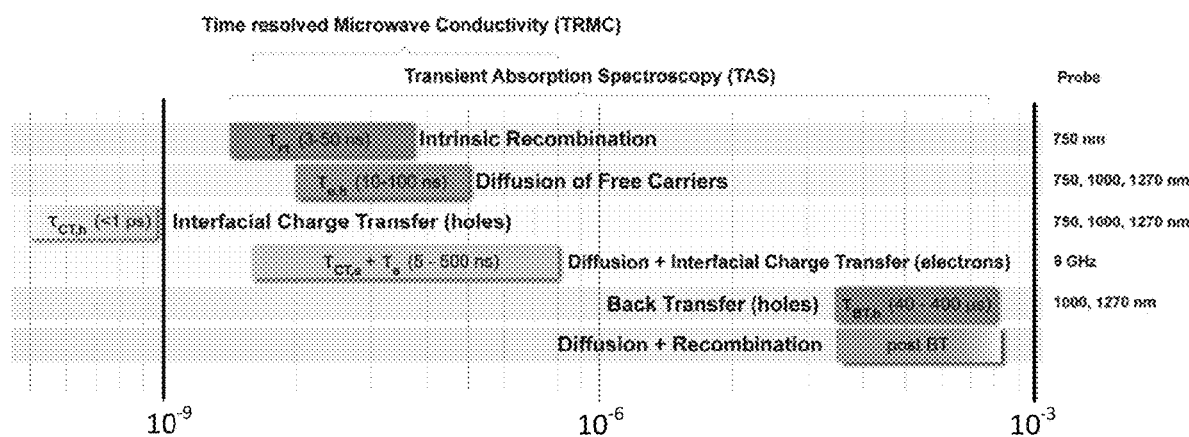

A kinetic scheme emerges from the detailed time-resolved measurements, as depicted in FIG. 10a. FIG. 10b summarizes the time scales of each process, along with the probe wavelength and spectroscopic measurement used to follow the processes. Carriers generated in the alkyl ammonium metal halide perovskite layer recombine with average time constants of several tens of nanoseconds in the absence of the s-SWCNT HTL. Diffusion of holes to the SWCNT HTL occurs over the course of approximately 3 ns, with a diffusion constant of approximately 0.3 cm$^2$/Vs, where hole injection into the SWCNT HTL then occurs on a sub-picosecond time scale. Electron injection into the TiO$_2$ ETL is slower, and is observed (for samples with a s-SWCNT HTL) by the loss of 9 GHz absorption in the TRMC measurement over the course approximately 450 ns. Following extraction of both charge carriers into the respective transport layers, back-transfer (and subsequent recombination, not directly observed) is very slow. The time constant of back-transfer is in the range of 40-420 μs ($\lambda_{probe}$=1000 nm).

Figure 11A:
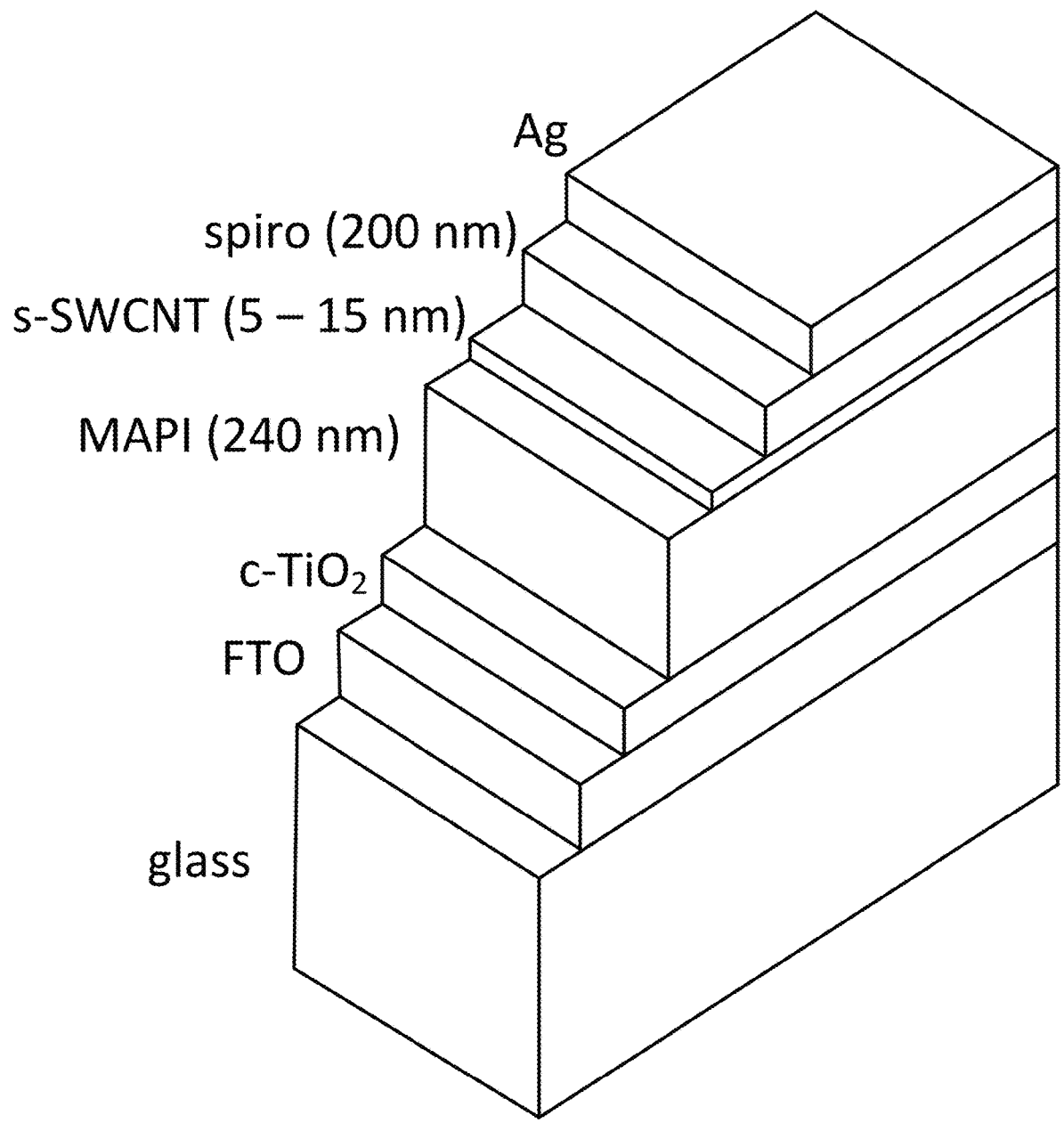
FIGS. 11a-c illustrate solar cell performance with and without SWCNT interfacial layers, according to some embodiments of the present disclosure.

The fast charge extraction and very slow recombination observed above suggest that purely semiconducting SWCNT HTLs or interfacial layers could improve the performance of MAPbI$_3$ PV devices. With these considerations in mind, s-SWCNT films were tested as thin interfacial layers between a MAPbI$_3$ absorber layer and a traditional spiro-MeOTAD HTL (see FIG. 11a) to improve hole extraction. In this role, the interfacial layer was very thin and did not provide a direct transport pathway to the charge collection electrode. Instead, the interfacial layer was used to establish the appropriate interfacial energetics that encouraged rapid charge extraction and slow recombination.

Figure 11B:
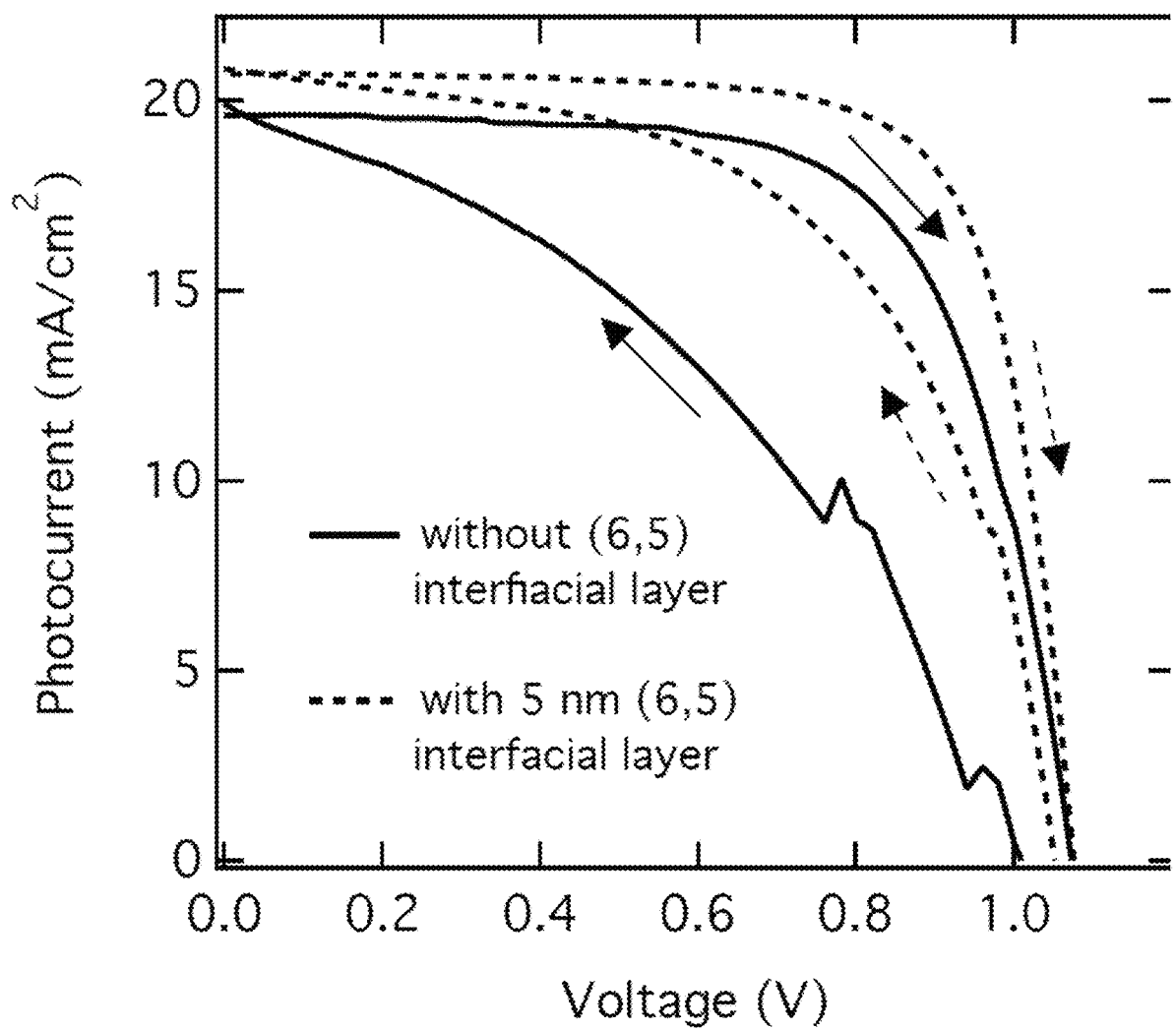
Figure 11C:
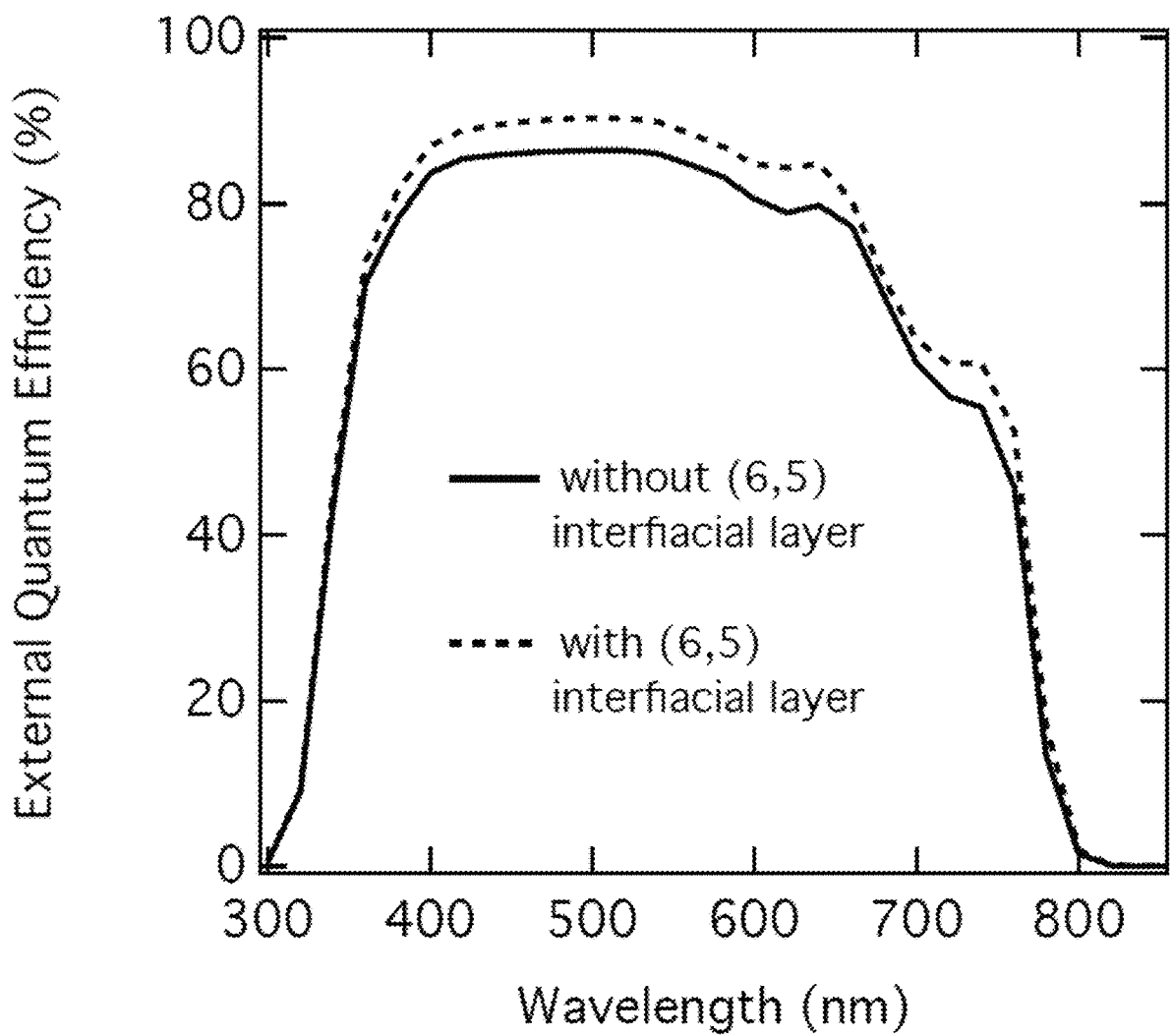
Figure 12:
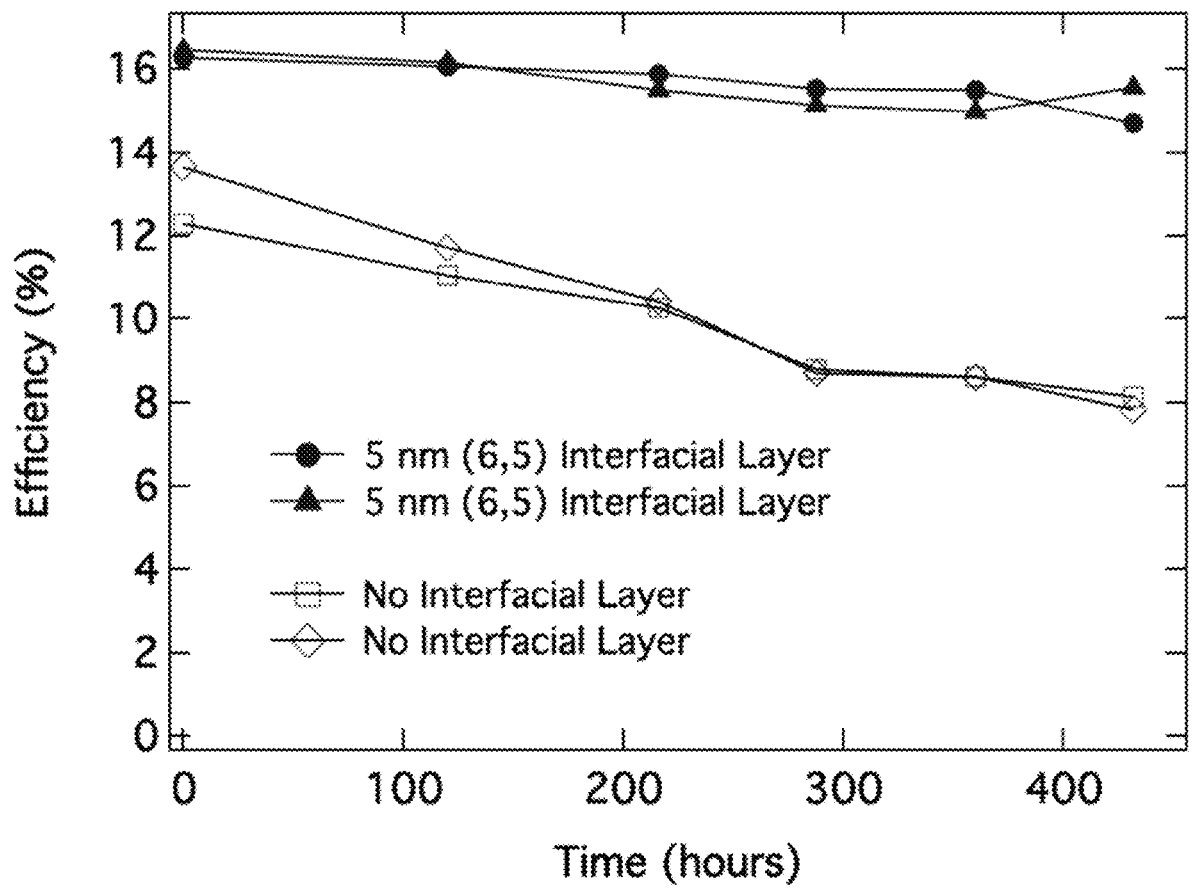
FIG. 12 illustrates representative stability experiments for devices prepared with or without 5 nm (6,5) s-SWCNT interfacial layers, according to some embodiments of the present disclosure. Initial efficiencies for (6,5)-modified devices were 16.3% and 16.5%, and initial efficiencies for devices without (6,5) interfacial layers were 12.3% and 13.7%.

FIG. 11b displays typical J-V curves for devices with either no interfacial layer or a 5 nm (6,5) s-SWCNT interfacial layer. In addition to improved efficiency, the devices with s-SWCNT interfacial layers also demonstrated significantly reduced hysteresis with regards to forward and reverse voltage scans and improved stability (see FIG. 12). The reduced hysteresis most likely stems from a reduced interfacial trapping probability for both holes and electrons, as the time-resolved measurements demonstrate efficient extraction of both charge carriers. The improvement in J$_{sc}$ is directly reflected in an increase to the external quantum efficiency over the entire wavelength range captured by the MAPbI$_3$ absorber layer (see FIG. 11c).

Table 1 summarizes the performance for a series of devices, prepared on top of an identical TiO$_2$ ETL, with different (6,5) s-SWCNT interfacial layer thicknesses. The device with the thinnest (6,5) s-SWCNT interfacial layers showed improved J$_{sc}$, V$_{oc}$, FF, and power conversion efficiency, and these improvements diminish with increasing s-SWCNT thickness. The average efficiency for devices utilizing a 5 nm (6,5) s-SWCNT interfacial layer was 16.1%, with a maximum efficiency of 16.5%, representing an approximate 2% increase in the absolute efficiency over reference devices. While all device parameters improved, the largest improvements were seen for J$_{sc}$ and FF. As expected from the similarity in charge extraction kinetics for (6,5) and LV s-SWCNTs (see FIGS. 4a and 9b), devices prepared with LV s-SWCNT interfacial layers showed the same improvements observed for the (6,5) interfacial layers.

It is important to note that the s-SWCNTs in these interfacial layers play very different roles compared to devices utilizing thick SWCNT HTLs (within insulating matrices) to provide direct transport pathways from MAPbI$_3$ to a metal electrode. In the examples provided herein, thick (~200 nm) layers of the doped spiro-MeOTAD HTL are used. The very thin (and purely semiconducting) SWCNT layers have low surface roughness (<5 nm), so there are very few, if any, SWCNT bundles that provide a direct transport pathway between the MAPbI$_3$ absorber layer and the metal electrode. Instead, the TA/TRMC results covered here suggest that the s-SWCNT interfacial layers most likely improve efficiency by establishing the appropriate interfacial energetics to facilitate fast hole extraction and slow recombination.

TABLE 1

Device parameters for MAPbI$_3$ solar cells prepared on an identical TiO$_2$ ETL and capped with a spiro-MeOTAD HTL. The devices either contained no interfacial layer or utilized (6,5) s-SWCNT interfacial layers with various thicknesses. For control devices, prepared with no interfacial layer, the MAPbI$_3$ surface was treated with toluene via ultrasonic spray-coating, in similar fashion to the (6,5) s-SWCNT deposition step.

| Interfacial Layer | J$_{sc}$ (avg) mA/cm$^2$ | V$_{oc}$ (avg) V | FF (avg) | PCE (avg) % | PCE (max) % |
|---|---|---|---|---|---|
| none | 19.9 ± 0.2 | 1.04 ± 0.02 | 0.68 ± 0.03 | 14.1 ± 0.4 | 14.7 |
| (6, 5) 5 nm | 20.8 ± 0.3 | 1.07 ± 0.009 | 0.73 ± 0.02 | 16.1 ± 0.3 | 16.5 |
| (6, 5) 10 nm | 20.0 ± 0.3 | 1.06 ± 0.002 | 0.71 ± 0.02 | 15.0 ± 0.2 | 15.2 |
| (6, 5) 15 nm | 19.4 ± 0.5 | 1.03 ± 0.002 | 0.65 ± 0.04 | 13.1 ± 0.6 | 13.7 |
| LV 5 nm | 21.1 ± 0.1 | 1.03 ± 0.003 | 0.73 ± 0.006 | 15.9 ± 0.2 | 16.1 |
| LV 10 nm | 21.4 ± 0.3 | 1.03 ± 0.004 | 0.68 ± 0.008 | 14.9 ± 0.3 | 15.2 |
| LV 15 nm | 21.7 ± 0.1 | 1.01 ± 0.002 | 0.60 ± 0.006 | 13.2 ± 0.2 | 13.3 |
| None/toluene | 20.5 ± 0.03 | 1.05 ± 0.006 | 0.66 ± 0.04 | 14.23 ± 0.8 | 14.8 |

This work demonstrates, for a technologically relevant perovskite PV device stack, that the narrow material-specific spectroscopic signatures of a charged s-SWCNT HTL can be used to unambiguously track the kinetics of critical processes, such as carrier diffusion, interfacial charge transfer, and recombination. Importantly, highly enriched semiconducting SWCNT HTLs or interfacial layers provide ordersof-magnitude temporal separation for the charge extraction and recombination rates. The connection of our time-resolved spectroscopic measurements to improved device efficiencies provides a direct link between the improved charge extraction and slow recombination observed in our time-resolved measurements and the PV device performance that depends sensitively on the kinetics of these processes. The results presented herein indicate that thin s-SWCNT interfacial layers may represent an economical way to improve perovskite solar cell performance for a variety of HTLs.

Experimental Methods

Perovskite film preparation: Fluorine-doped tin oxide (FTO, TEC15, Hartford, Ind.) was cleaned by an overnight base bath soaking (5 wt % NaOH in ethanol). A compact $TiO_2$ layer was deposited by spray pyrolysis of 0.2 M titanium diisopropoxide bis(acetylacetonate) in 1-butanol solution at 450° C. A modified method based on the solvent engineering approach was used to deposit perovskite film. Therein the precursor was made of 44 wt % of 1:1 molar ratio of MAI and $PbI_2$ in γ-Butyrolactone (GBL, Aldrich)/dimethyl sulfoxide (DMSO, Sigma-Aldrich) (7/3 v/v). The substrates were spun at 4500 rpm for 50 seconds with a drop of toluene being casted during the spinning. The perovskite film was fully crystalized by annealing at 85° C. for 10 minutes. Perovskite films on glass substrates for the TAS control measurements were prepared in the same manner except without the $TiO_2$ spray pyrolysis process.

Single-walled carbon nanotube layer preparation: CoMo-Cat SG65i SWCNTs were purchased from Southwest Nanotechnologies, Inc., and PFO-BPy was purchased from American Dye Source. Laser vaporization (LV) nanotubes were synthesized in house at a synthesis temperature of 1125° C. SWCNTs were dispersed at a loading of ~1 mg/mL in ~2.5 mg/mL PFO-BPy in toluene (10-15 mL total volume) through tip sonication for 30 minutes (Cole-Palmer CPX 750) in a bath of cool (18° C.) flowing water. Following sonication, undispersed material was removed by ultracentrifugation for 5 minutes using an SW32Ti motor (Beckman) at 13,200 rpm and 20° C. The supernatant was retained, and several of these supernatants were combined to produce larger volumes. To remove excess polymer, these larger volumes (30-35 mL) were centrifuged for 20 hours at 24,100 rpm and 0° C. In this case, the resulting supernatant (containing excess polymer unbound to SWCNTs) was discarded and the pellet containing (6,5) or LV SWCNT material was redispersed in toluene. This polymer removal process was repeated until a SWCNT:PFO-BPy mass ratio of ~1:1 was obtained. (6,5) and LV SWCNT thin films with thicknesses in the range of ~10 nm were prepared through ultrasonic spray deposition onto the $MAPbI_3$ films (or other substrates) using a dispersion flow rate of 0.25 mL/min and gas flow rate of 7.0 std L/min. The nozzle power was fixed at 0.8 W and the substrate was heated to 130° C. to allow for evaporation of the solvent. After spraying, the films were soaked in a toluene bath (80° C.) to remove some residual polymer and better couple SWCNTs within the film. To avoid potential photo-degradation during the TA experiments, the films were introduced into a helium glovebox and another quartz slide was sealed on top of the sample using a polymer film (Surlyn, Solaronix) heated to 90° C. The polymer was cut into a hollow frame so that it only sealed the outer edges of the slide and did not interfere with the sample. Note that for these spectroscopic measurements the stack was not completed with a final metal contact on top of the HTL which had no significant effect on hole extraction at the $MAPbI_3$/HTL interface.

Steady-state absorbance measurements: UV-vis absorbance measurements were carried out using a Cary6000i spectrophotometer equipped with the diffuse reflectance accessory. For each sample, transmission (T) and reflectance (R) were collected from 1800-200 nm with light incident on the quartz/$TiO_2$ interface. The absorbance was calculated according to A=-log (T-R).

Femtosecond transient absorption measurements: Femtosecond pump-probe TA experiments were carried out on a system that utilizes a 1-kHz regeneratively amplified Ti:Sapphire laser system (Coherent Libra) that produces laser pulses (100 fs, 4 mJ) at 800 nm. The Ti:Sapphire laser pumps an optical parametric amplifier (OPA) to generate 400 nm light, which was chopped at a rate of 500 Hz and used as the excitation pump pulse. The pump fluence was in the range of $\sim 5\times 10^{13}$ and $\sim 3\times 10^{12}$ photons $pulse^{-1}$ $cm^{-2}$ for near-IR and visible probe measurements, respectively. Continuum probe pulses (in the range of 800 nm-1700 nm for near-IR and 400 nm-800 nm for visible) were generated by passing a portion of the amplified 800 nm light through a sapphire plate. For "short-delay" experiments ($t_{delay} \leq 5$ ns), the probe pulse was delayed in time with respect to the pump pulse using a motorized translation stage mounted with a retro-reflecting mirror. For 0.1 ns to μs experiments, a separate probe source (EOS, Ultrafast Systems) was used that can be electronically delayed with respect to the fs pump. This source was a VIS/NIR broadband continuum that allowed for seamless connection between data from time delays on the fs/ps to ~0.5 ms time scale. No change in sample position or excitation conditions was required for switching between the two modes of probing.

Figure 13:
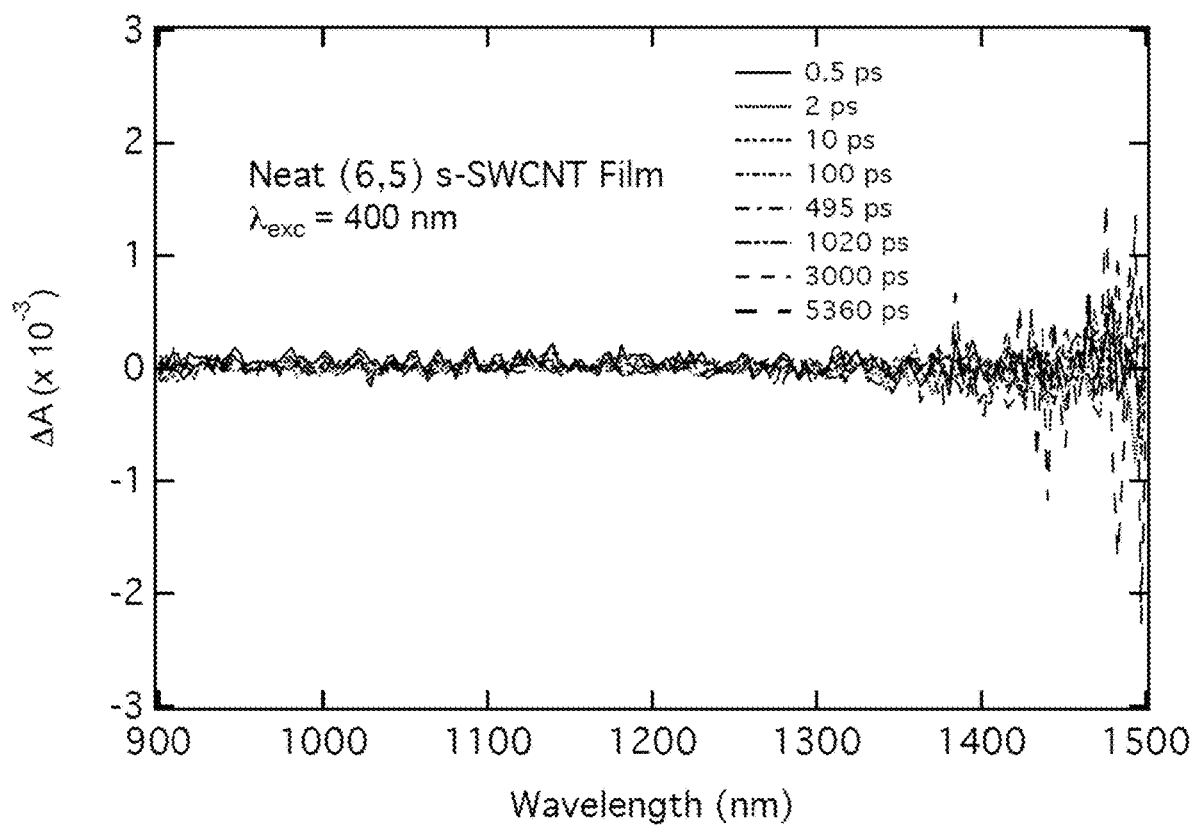
FIG. 13 illustrates control pump-probe experiments showing TA spectra for neat (6,5) SWCNT thin film (10 nm) pumped at 400 nm with fluence of $2\times10^{11}$ photons/cm²/pulse, according to some embodiments of the present disclosure. This fluence corresponds to the illumination intensity seen by the SWCNT HTL following Beer-Lambert decay through the MAPI layer upon "backside" illumination for trilayer samples measured in the main manuscript. The control experiment demonstrates that no signal can be seen for the SWCNTs under these illumination conditions, confirming that all signal in the SWCNT layer for a trilayer ($TiO_2/MAPI/SWCNT$) sample results from hole transfer from the photoexcited MAPI layer into the SWCNT thin film.
Figure 14A:
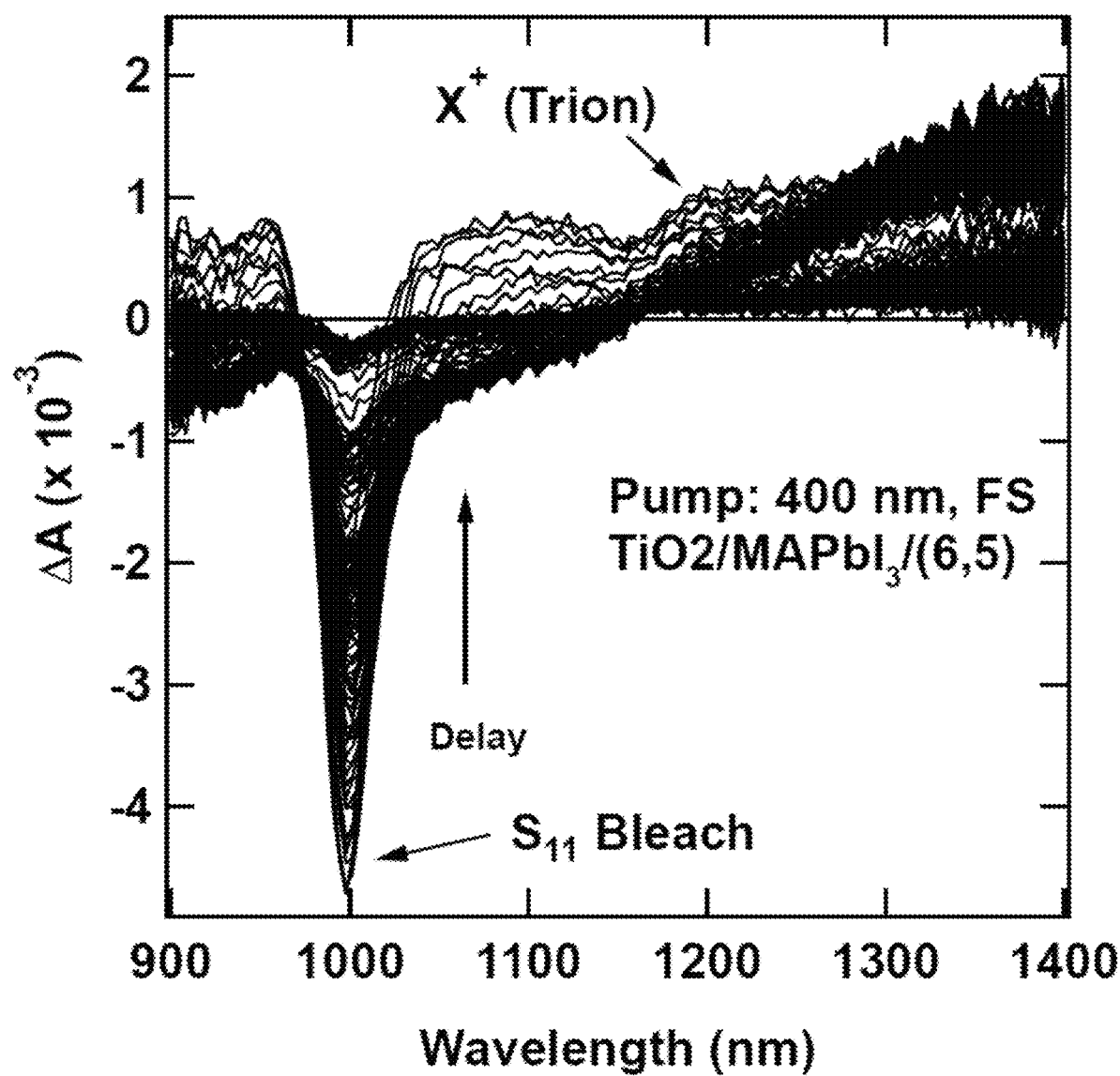
FIGS. 14a and 14b illustrate representative TA spectra for a frontside illumination experiment on a $TiO_2/MAPbI_3/(6,5)$ trilayer sample, according to some embodiments of the present disclosure.
Figure 14B:
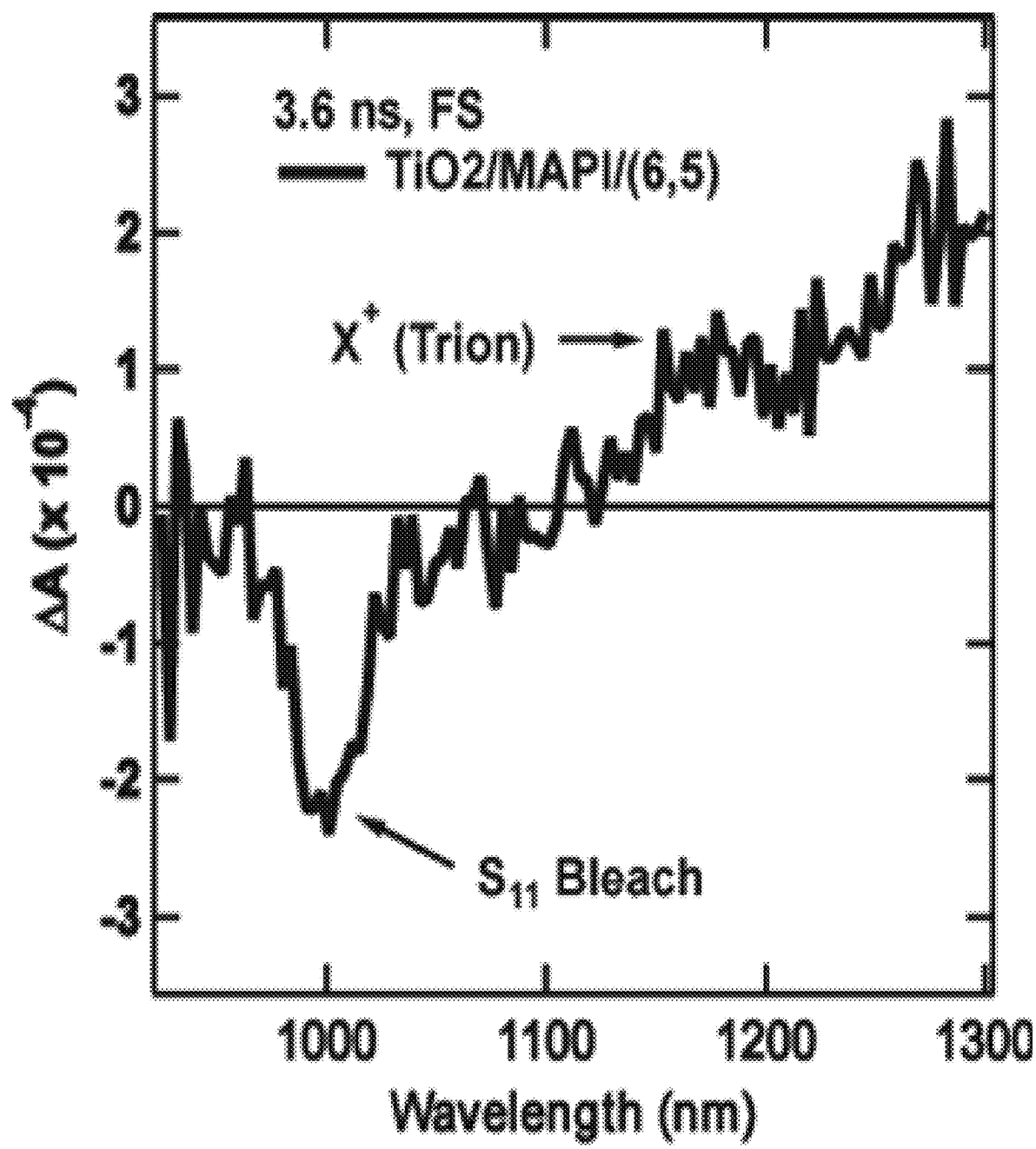
Figure 15:
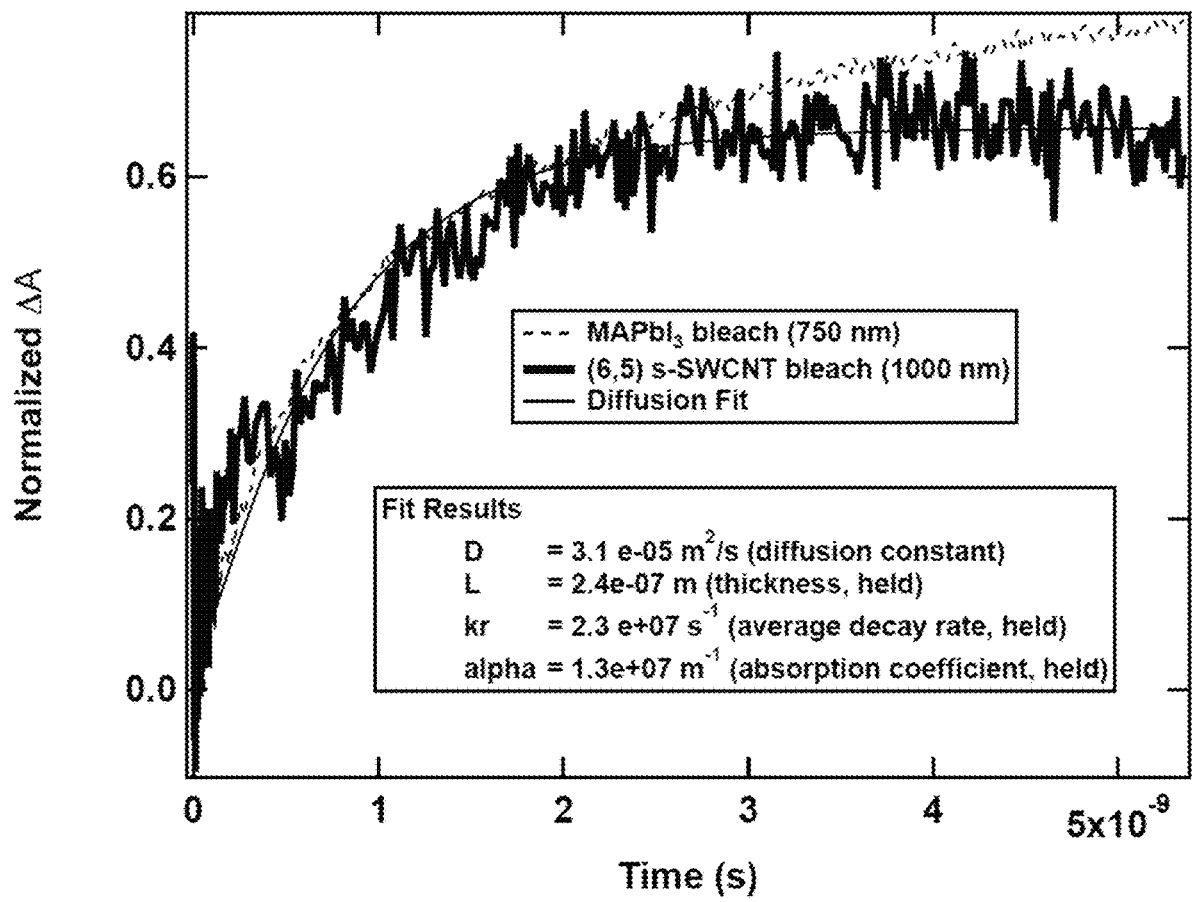
FIG. 15 illustrates modeling of the TA dynamics at 1000 nm (rise time of (6,5) s-SWCNT holes) and at 750 nm (loss of MAPI holes) for photoexcited trilayer sample ($TiO_2/MAPI/(6,5)$-SWCNT) following photoexcitation at 400 nm, according to some embodiments of the present disclosure.

Pump and probe beams were spatially overlapped at the quartz slide, and the sample was excited either through the SWCNT or perovskite layer first. For most measurements, we excited through the perovskite layer first, and we refer to this direction as "backside" illumination. This study focused primarily on backside illumination, since this illumination direction mimics the illumination in a typically prepared perovskite solar cell, and also allows us to generate excitons/carriers primarily in the perovskite layer. To confirm this, control studies were performed on neat SWCNT films, exciting the SWCNTs with a fluence that matched that reaching the perovskite/SWCNT interface following exponential decay through the ~240 nm thick perovskite layer (and any reflection). See FIG. 13 for this control experiment. FIGS. 14a and 14b display an example of a frontside illumination experiment. Typical averaging times for data collection were 5-8 seconds, at each pump-probe delay, to achieve high signal-to-noise. The instrument response function (IRF) was ~120 fs.

Flash-photolysis time-resolved microwave conductivity: TRMC probes the generation and decay of free charge carriers by measuring the time-dependent absorption of a 9 GHz microwave probe by a photoexcited sample. Flash photolysis time resolved microwave conductivity (fp-TRMC) measurements were performed using a pulsed Q-switched Nd:YAG laser (3-5 ns pulses, Continuum Powerlite) and an optical parametric oscillator (Continuum Panther) pumped by the third harmonic (355 nm). Bilayer and neat films on quartz substrates were placed in an X-band microwave cavity to monitor the transient change in microwave power, ΔP(t). In all TRMC measurements, the excitation direction was through the quartz slide (backside illumination). In all TRMC measurements, the sample cavity was actively purged with dry nitrogen gas to maintain an inert environment and avoid photo-degradation. The transient change in the microwave power is related to the transient change in photoconductance, $\Delta G(t)$, by:

$$\Delta G(t) = -\frac{1}{K}\frac{\Delta P(t)}{P} \quad (1)$$

In Equation 1, K is an experimental sensitivity factor of the measurement, which depends on the dimensions of the waveguide, the conductivity of the inner walls of the waveguide, and the dielectric properties of the sample loaded into the waveguide. The magnitude of $\Delta G$ following photoexcitation is proportional to the photo-generated free carrier generation yield ($\phi$) and the sum of the high-frequency free carrier mobilities ($\Sigma\mu$) by the following:

$$\Delta G = \beta q_e \cdot I_0 F_A \cdot \phi \Sigma \mu \quad (2)$$

In Equation 2, $\beta=2.2$ and represents the ratio between the long (2.286 cm) and short (1.016 cm) axes of the microwave waveguide, $q_e$ is the elementary charge, $I_0$ is the incident photon flux, and $F_A$ is the fractional light absorption (determined from film absorptance).

Solar cell fabrication and characterization: Fluorine-doped tin oxide (FTO, TEC15, Hartford, Ind.) was patterned by a wet etching (5M hydrochloric acid and zinc powder), followed by an overnight base bath (5 wt % NaOH in ethanol). A compact $TiO_2$ layer was deposited by a spray pyrolysis of 0.2 M titanium diisopropoxide bis(acetylacetonate) in 1-butanol solution at 450° C. An antisolvent fast crystallization method was used to deposit perovskite film. Precursor was made of 1.4M equimolar MAI and PbI2 in γ-Butyrolactone (GBL, Aldrich)/dimethyl sulfoxide (DMSO, Sigma-Aldrich) (7/3 v/v). Substrate was spun at 4000 rpm for 50 s, and a drop of toluene was casted during the spinning. Perovskite film was fully crystalized by annealing at 85° C. for 10 minutes. The SWCNT interfacial layers were sprayed on top of the $MAPbI_3$ layer right after the fabrication of the $MAPbI_3$ film. The doped spiro-MeO-TAD hole transport layer (HTL) was spin-coated on top of SWCNT-modified perovskite at 4,000 rpm for 35 seconds with a HTL solution, which includes of 80 mg 2,2',7,7'-tetrakis(N,N-dip-methoxyphenylamine)-9,9'-spirobifluorene (Spiro-MeOTAD; Merck), 30 µl bis(trifluoromethane) sulfonimide lithium salt stock solution (500 mg Li-TFSI in 1 ml acetonitrile), and 30 µl 4-tert-butylpyridine (TBP), and 1 ml chlorobenzene solvent. Finally a 150 nm Ag layer was deposited on the HTL layer by thermal evaporation.

The J-V characteristics of the cells were measured by a 2400 SourceMeter (Keithley) under simulated one-sun AM 1.5 G illumination (100 mW $cm^{-2}$) (Oriel Sol3A Class AAA Solar Simulator, Newport Corporation). A shadow mask with 0.12 $cm^2$ active area was used for the measurement. External quantum efficiency (EQE) measurements were carried out by a solar cell quantum efficiency measurement system (QEX10, PV Measurements). For stability measurements (FIG. 12), samples were stored in a glovebox in ambient light between measurements. The samples were taken out into ambient lab conditions (relative humidity between 15% and 40%) for J-V characterization each 3-4 days. Solar cell characterization took approximately one hour, after which samples were returned to the glovebox.

The foregoing discussion and examples have been presented for purposes of illustration and description. The foregoing is not intended to limit the aspects, embodiments, or configurations to the form or forms disclosed herein, in the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present disclosure, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
   an alkyl ammonium metal halide perovskite layer;
   a nanostructured semiconductor layer in physical contact with the alkyl ammonium metal halide perovskite layer; and
   a hole transport layer, wherein:
   the nanostructured semiconductor layer is positioned between the hole transport layer and the alkyl ammonium metal halide perovskite layer, and
   the nanostructured semiconductor layer consists essentially of at least one organic nanostructure and a polymer.

2. The device of claim 1, wherein the alkyl ammonium metal halide perovskite layer comprises methyl ammonium cations.

3. The device of claim 1, wherein the alkyl ammonium metal halide perovskite layer comprises anions of at least one of chlorine, bromine, astatine, or iodine.

4. The device of claim 1, wherein the alkyl ammonium metal halide perovskite layer comprises cations of a metal in a 2+ valence state.

5. The device of claim 4, wherein the metal comprises at least one of lead, tin, or germanium.

6. The device of claim 1, wherein the organic nanostructure comprises at least one of a carbon nanotube, a graphene quantum dot, or a carbon dot.

7. The device of claim 1,
   the nanostructured semiconductor layer is in physical contact with the hole transport layer.

8. The device of claim 1, wherein the hole transport layer comprises at least one of spiro-MeOTAD, polyhexyl (3-thiophene), or an inorganic oxide.

9. The device of claim 1, further comprising a conducting layer, wherein the hole transport layer is positioned between the conducting layer and the nanostructured semiconductor layer.

10. The device of claim 9, further comprising an electron transport layer, wherein the alkyl ammonium metal halide perovskite layer is positioned between the hole transport layer and the electron transport layer.

11. The device of claim 10, further comprising a transparent conducting oxide layer, wherein the electron transport layer is positioned between the transparent conducting oxide layer and the alkyl ammonium metal halide perovskite layer.

12. The device of claim 11, further comprising a substrate, wherein the transparent conducting oxide layer is positioned between the substrate and the electron transport layer.

13. The device of claim 6, wherein the carbon nanotube comprises a semiconducting single-walled carbon nanotube (s-SWCNT).

14. The device of claim 13, wherein the polymer and the s-SWCNT are present at a mass ratio of about 1:1 (polymer:s-SWCNT).

15. The device of claim 13, wherein the s-SWCNT is at a purity of greater than 99% semiconducting material.

16. The device of claim 1, wherein the nanostructured semiconductor layer has a thickness between 5 nm and 15 nm.

17. The device of claim 1, wherein the polymer comprises PFO-BPy.

* * * * *